US012786275B2

(12) United States Patent
Petiwala

(10) Patent No.: US 12,786,275 B2
(45) Date of Patent: Nov. 3, 2026

(54) VEHICLE MAINTENANCE SYSTEM WITH DYNAMIC NETWORK

(71) Applicant: Midtronics, Inc., Willowbrook, IL (US)

(72) Inventor: Mohammed H. Petiwala, Buffalo Grove, IL (US)

(73) Assignee: MIDTRONICS, INC., Willowbrook, IL (US)

(*) Notice: Subject to any disclaimer, the term of this patent is extended or adjusted under 35 U.S.C. 154(b) by 51 days.

(21) Appl. No.: 18/930,713

(22) Filed: Oct. 29, 2024

(65) Prior Publication Data

US 2025/0141966 A1 May 1, 2025

Related U.S. Application Data

(60) Provisional application No. 63/594,195, filed on Oct. 30, 2023.

(51) Int. Cl.

*H04L 67/12* (2022.01)
*B25J 9/16* (2006.01)
*G01R 31/385* (2019.01)
*G07C 5/00* (2006.01)

(52) U.S. Cl.

CPC ............. *H04L 67/12* (2013.01); *B25J 9/1656* (2013.01); *G01R 31/385* (2019.01); *G07C 5/008* (2013.01); *G07C 2205/02* (2013.01)

(58) Field of Classification Search

CPC ....... H04L 67/12; G01R 31/385; G07C 5/008; G07C 2205/02

See application file for complete search history.

(56) References Cited

U.S. PATENT DOCUMENTS

| | | | | |
|---|---|---|---|---|
| 85,553 | A | 1/1869 | Adams | 33/472 |
| 2,000,665 | A | 5/1935 | Neal | 439/440 |
| 2,254,846 | A | 9/1941 | Heyer | 324/437 |
| 2,417,940 | A | 3/1947 | Lehman | 200/61.25 |
| 2,437,772 | A | 3/1948 | Wall | 324/523 |
| 2,514,745 | A | 7/1950 | Dalzell | 324/115 |
| 2,689,939 | A | 9/1954 | Godshalk | |
| 2,727,221 | A | 12/1955 | Springg | 340/447 |
| 3,025,455 | A | 3/1962 | Jonsson | 323/369 |

(Continued)

FOREIGN PATENT DOCUMENTS

| | | | |
|---|---|---|---|
| CN | 2470964 | Y | 1/2002 |
| CN | 201063352 | Y | 5/2008 |

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — Shirley X Zhang

(74) *Attorney, Agent, or Firm* — Westman, Champlin & Koehler, P.A.

(57) ABSTRACT

A plurality of automotive tools each of which includes communication circuitry which provides communication between at least another tool in the plurality of tools, cluster forming circuitry configured to form a cluster comprises at least two tools in the plurality of tools, and data sharing circuitry configured to share data between the at least two tools in the cluster.

18 Claims, 9 Drawing Sheets

(56) References Cited

U.S. PATENT DOCUMENTS 3,178,686 A 4/1965 Mills .......... 340/447
3,215,194 A 11/1965 Sununu et al. .......... 165/80.3
3,223,969 A 12/1965 Alexander .......... 340/447
3,267,452 A 8/1966 Wolf .......... 340/249
3,356,936 A 12/1967 Smith .......... 324/429
3,562,634 A 2/1971 Latner .......... 324/427
3,593,099 A 7/1971 Scholl .......... 320/127
3,607,673 A 9/1971 Seyl .......... 324/425
3,652,341 A 3/1972 Halsall et al. .......... 29/623.2
3,676,770 A 7/1972 Sharaf et al. .......... 324/430
3,699,433 A 10/1972 Smith, Jr. .......... 324/523
3,704,439 A 11/1972 Nelson
3,729,989 A 5/1973 Little .......... 73/862.192
3,745,441 A 7/1973 Soffer .......... 290/14
3,750,011 A 7/1973 Kreps .......... 324/430
3,753,094 A 8/1973 Furuishi et al. .......... 324/430
3,776,177 A 12/1973 Bryant et al. .......... 116/311
3,796,124 A 3/1974 Crosa .......... 411/521
3,808,401 A 4/1974 Wright et al.
3,808,522 A 4/1974 Sharaf .......... 324/430
3,808,573 A 4/1974 Cappell
3,811,089 A 5/1974 Strezelewicz .......... 324/170
3,816,805 A 6/1974 Terry .......... 320/123
3,850,490 A 11/1974 Zehr .......... 439/822
3,857,082 A 12/1974 Van Opijnen .......... 320/143
3,873,911 A 3/1975 Champlin .......... 324/430
3,876,931 A 4/1975 Godshalk .......... 324/429
3,879,654 A 4/1975 Kessinger .......... 324/434
3,886,426 A 5/1975 Daggett .......... 320/117
3,886,443 A 5/1975 Miyakawa et al. .......... 324/426
3,889,248 A 6/1975 Ritter .......... 340/636.11
3,906,329 A 9/1975 Bader .......... 320/134
3,909,708 A 9/1975 Champlin .......... 324/431
3,920,284 A 11/1975 Lane et al. .......... 303/122.06
3,936,744 A 2/1976 Perlmutter .......... 324/772
3,939,400 A 2/1976 Steele .......... 324/434
3,946,299 A 3/1976 Christianson et al. .......... 320/430
3,947,757 A 3/1976 Grube et al. .......... 324/416
3,969,667 A 7/1976 McWilliams .......... 324/427
3,979,664 A 9/1976 Harris .......... 324/397
3,984,762 A 10/1976 Dowgiallo, Jr. .......... 324/430
3,984,768 A 10/1976 Staples .......... 324/712
3,989,544 A 11/1976 Santo .......... 429/65
3,997,830 A 12/1976 Newell et al. .......... 320/102
4,008,619 A 2/1977 Alcaide et al. .......... 73/724
4,023,882 A 5/1977 Pettersson .......... 439/426
4,024,953 A 5/1977 Nailor, III .......... 206/344
4,045,718 A 8/1977 Gray
4,047,091 A 9/1977 Hutchines et al. .......... 363/59
4,053,824 A 10/1977 Dupuis et al. .......... 324/434
4,056,764 A 11/1977 Endo et al. .......... 320/101
4,057,313 A 11/1977 Polizzano .......... 439/219
4,070,624 A 1/1978 Taylor .......... 324/772
4,086,531 A 4/1978 Bernier .......... 324/772
4,106,025 A 8/1978 Katz .......... 343/715
4,112,351 A 9/1978 Back et al. .......... 324/380
4,114,083 A 9/1978 Benham et al. .......... 340/636.13
4,126,874 A 11/1978 Suzuki et al. .......... 396/301
4,160,916 A 7/1979 Papasideris .......... 307/10.6
4,176,315 A 11/1979 Sunnarborg .......... 324/133
4,178,546 A 12/1979 Hulls et al. .......... 324/772
4,193,025 A 3/1980 Frailing et al. .......... 324/427
4,207,610 A 6/1980 Gordon .......... 701/33.9
4,207,611 A 6/1980 Gordon .......... 701/33
4,217,645 A 8/1980 Barry et al. .......... 702/63
4,218,745 A 8/1980 Perkins .......... 324/66
4,280,457 A 7/1981 Bloxham .......... 123/198 R
4,295,468 A 10/1981 Bartelt
4,297,639 A 10/1981 Branham .......... 324/429
4,307,342 A 12/1981 Peterson .......... 324/767
4,315,204 A 2/1982 Sievers et al. .......... 322/28
4,316,185 A 2/1982 Watrous et al. .......... 340/636.11
4,322,685 A 3/1982 Frailing et al. .......... 324/429
4,351,405 A 9/1982 Fields et al. .......... 180/65.2
4,352,067 A 9/1982 Ottone .......... 324/434
4,360,780 A 11/1982 Skutch, Jr. .......... 324/437
4,361,809 A 11/1982 Bil et al. .......... 324/426
4,363,407 A 12/1982 Buckler et al. .......... 209/3.3
4,369,407 A 1/1983 Korbell .......... 324/416
4,379,989 A 4/1983 Kurz et al. .......... 320/165
4,379,990 A 4/1983 Sievers et al. .......... 322/99
4,385,269 A 5/1983 Aspinwall et al. .......... 320/129
4,390,828 A 6/1983 Converse et al. .......... 320/153
4,392,101 A 7/1983 Saar et al. .......... 320/156
4,396,880 A 8/1983 Windebank .......... 320/156
4,408,157 A 10/1983 Beaubien .......... 324/712
4,412,169 A 10/1983 Dell'Orto .......... 320/123
4,423,378 A 12/1983 Marino et al. .......... 324/427
4,423,379 A 12/1983 Jacobs et al. .......... 324/429
4,424,491 A 1/1984 Bobbett et al. .......... 324/433
4,425,791 A 1/1984 Kling .......... 73/116.02
4,441,359 A 4/1984 Ezoe .......... 73/116.06
4,459,548 A 7/1984 Lentz et al. .......... 324/472
4,484,140 A 11/1984 Dieu
4,502,000 A 2/1985 Mashikian
4,514,694 A 4/1985 Finger .......... 324/429
4,520,353 A 5/1985 McAuliffe .......... 340/636.16
4,521,498 A 6/1985 Juergens .......... 429/59
4,544,312 A 10/1985 Stencel
4,560,230 A 12/1985 Inglis .......... 439/890
4,564,798 A 1/1986 Young .......... 320/103
4,620,767 A 11/1986 Woolf .......... 439/217
4,626,765 A 12/1986 Tanaka .......... 320/127
4,633,418 A 12/1986 Bishop .......... 702/63
4,637,359 A 1/1987 Cook .......... 123/179
4,643,511 A 2/1987 Gawlik .......... 439/755
4,659,977 A 4/1987 Kissel et al. .......... 320/150
4,663,580 A 5/1987 Wortman .......... 320/153
4,665,370 A 5/1987 Holland .......... 324/429
4,667,143 A 5/1987 Cooper et al. .......... 320/153
4,667,279 A 5/1987 Maier .......... 363/46
4,678,998 A 7/1987 Muramatsu .......... 324/427
4,679,000 A 7/1987 Clark .......... 324/428
4,680,528 A 7/1987 Mikami et al. .......... 320/165
4,686,442 A 8/1987 Radomski .......... 320/123
4,697,134 A 9/1987 Burkum et al. .......... 320/134
4,707,795 A 11/1987 Alber et al. .......... 702/63
4,709,202 A 11/1987 Koenck et al. .......... 320/112
4,710,861 A 12/1987 Kanner .......... 363/46
4,719,428 A 1/1988 Liebermann .......... 324/436
4,723,656 A 2/1988 Kiernan et al. .......... 206/705
4,743,855 A 5/1988 Randin et al. .......... 324/430
4,745,349 A 5/1988 Palanisamy et al. .......... 320/125
4,773,011 A 9/1988 VanHoose .......... 701/30
4,781,629 A 11/1988 Mize .......... 439/822
D299,909 S 2/1989 Casey .......... D10/77
4,816,768 A 3/1989 Champlin .......... 324/428
4,820,966 A 4/1989 Fridman .......... 320/116
4,825,170 A 4/1989 Champlin .......... 324/436
4,826,457 A 5/1989 Varatta .......... 439/504
4,847,547 A 7/1989 Eng, Jr. et al. .......... 320/153
4,849,700 A 7/1989 Morioka et al. .......... 324/427
4,874,679 A 10/1989 Miyagawa .......... 429/91
4,876,495 A 10/1989 Palanisamy et al. .......... 320/106
4,881,038 A 11/1989 Champlin .......... 324/426
4,885,523 A 12/1989 Koench .......... 230/131
4,888,716 A 12/1989 Ueno .......... 702/63
4,901,007 A 2/1990 Sworm .......... 324/110
4,907,176 A 3/1990 Bahnick et al. .......... 364/551.01
4,912,416 A 3/1990 Champlin .......... 324/430
4,913,116 A 4/1990 Katogi et al. .......... 123/406.32
4,926,330 A 5/1990 Abe et al. .......... 701/33
4,929,931 A 5/1990 McCuen .......... 340/636.15
4,931,738 A 6/1990 MacIntyre et al. .......... 324/435
4,932,905 A 6/1990 Richards .......... 439/822
4,933,845 A 6/1990 Hayes .......... 710/104
4,934,957 A 6/1990 Bellusci .......... 439/504
4,937,528 A 6/1990 Palanisamy .......... 324/430
4,947,124 A 8/1990 Hauser .......... 324/430
4,949,046 A 8/1990 Seyfang .......... 324/427
4,956,597 A 9/1990 Heavey et al. .......... 320/129
4,965,738 A 10/1990 Bauer et al. .......... 320/136
4,968,941 A 11/1990 Rogers .......... 324/428
4,968,942 A 11/1990 Palanisamy .......... 324/430

(56) References Cited

U.S. PATENT DOCUMENTS 4,969,834 A 11/1990 Johnson ........ 439/141
4,983,086 A 1/1991 Hatrock ........ 411/259
5,004,979 A 4/1991 Marino et al. ........ 324/160
5,030,916 A 7/1991 Bokitch ........ 324/503
5,032,825 A 7/1991 Kuznicki ........ 340/636.15
5,034,893 A 7/1991 Fisher ........ 701/99
5,037,335 A 8/1991 Campbell ........ 439/217
5,037,778 A 8/1991 Stark et al. ........ 228/121
5,047,722 A 9/1991 Wurst et al. ........ 324/430
5,081,565 A 1/1992 Nabha et al. ........ 362/465
5,083,076 A 1/1992 Scott ........ 320/105
5,087,881 A 2/1992 Peacock ........ 324/378
5,095,223 A 3/1992 Thomas ........ 307/110
5,108,320 A 4/1992 Kimber ........ 439/883
5,109,213 A 4/1992 Williams ........ 340/447
5,126,675 A 6/1992 Yang ........ 324/435
5,130,658 A 7/1992 Bohmer ........ 324/435
5,140,269 A 8/1992 Champlin ........ 324/433
5,144,218 A 9/1992 Bosscha ........ 320/139
5,144,248 A 9/1992 Alexandres et al. ........ 324/428
D330,338 S 10/1992 Wang ........ D10/77
5,159,272 A 10/1992 Rao et al. ........ 324/429
5,160,881 A 11/1992 Schramm et al. ........ 322/7
5,164,653 A 11/1992 Reem
5,167,529 A 12/1992 Verge ........ 427/1
5,168,208 A 12/1992 Schultz et al. ........ 322/25
5,170,124 A 12/1992 Blair et al. ........ 324/434
5,179,335 A 1/1993 Nor ........ 320/159
5,187,382 A 2/1993 Kondo ........ 307/10.1
5,194,799 A 3/1993 Tomantschger ........ 320/103
5,202,617 A 4/1993 Nor
5,204,611 A 4/1993 Nor et al. ........ 320/145
5,214,370 A 5/1993 Harm et al. ........ 320/152
5,214,385 A 5/1993 Gabriel et al. ........ 324/434
5,223,747 A 6/1993 Tschulena ........ 257/713
5,241,275 A 8/1993 Fang ........ 324/430
5,254,952 A 10/1993 Salley et al. ........ 324/429
5,266,880 A 11/1993 Newland ........ 320/125
5,278,759 A 1/1994 Berra et al. ........ 701/1
5,281,919 A 1/1994 Palanisamy ........ 324/427
5,281,920 A 1/1994 Wurst ........ 324/430
5,295,078 A 3/1994 Stich et al. ........ 700/297
5,296,823 A 3/1994 Dietrich ........ 333/161
5,298,797 A 3/1994 Redl ........ 327/387
5,300,874 A 4/1994 Shimamoto et al. ........ 320/106
5,302,902 A 4/1994 Groehl ........ 324/434
5,309,052 A 5/1994 Kim ........ 174/350
5,313,152 A 5/1994 Wozniak et al. ........ 320/118
5,315,287 A 5/1994 Sol ........ 340/455
5,321,231 A 6/1994 Schmalzriedt et al.
5,321,626 A 6/1994 Palladino ........ 702/63
5,321,627 A 6/1994 Reher ........ 702/63
5,323,337 A 6/1994 Wilson et al. ........ 702/73
5,325,041 A 6/1994 Briggs ........ 320/149
5,331,268 A 7/1994 Patino et al. ........ 320/158
5,332,927 A 7/1994 Paul et al. ........ 307/66
5,336,993 A 8/1994 Thomas et al. ........ 324/158.1
5,338,515 A 8/1994 Dalla Betta et al. ........ 422/95
5,339,018 A 8/1994 Brokaw ........ 320/147
5,343,380 A 8/1994 Champlin ........ 363/46
5,345,384 A 9/1994 Przybyla et al. ........ 701/29.1
5,347,163 A 9/1994 Yoshimura ........ 307/66
5,349,535 A 9/1994 Gupta ........ 320/106
5,352,968 A 10/1994 Reni et al. ........ 320/136
5,357,519 A 10/1994 Martin et al. ........ 371/15.1
5,365,160 A 11/1994 Leppo et al. ........ 320/160
5,365,453 A 11/1994 Startup et al. ........ 702/36
5,369,364 A 11/1994 Renirie et al. ........ 324/430
5,381,096 A 1/1995 Hirzel ........ 324/427
5,384,540 A 1/1995 Dessel ........ 324/539
5,387,871 A 2/1995 Tsai ........ 324/429
5,394,093 A 2/1995 Cervas ........ 324/556
5,402,007 A 3/1995 Center et al. ........ 290/40 B
5,410,754 A 4/1995 Klotzbach et al. ........ 370/466
5,412,308 A 5/1995 Brown ........ 323/267
5,412,323 A 5/1995 Kato et al. ........ 324/429
5,425,041 A 6/1995 Seko et al. ........ 372/45.01
5,426,371 A 6/1995 Salley et al. ........ 324/429
5,426,416 A 6/1995 Jefferies et al. ........ 340/664
5,430,645 A 7/1995 Keller ........ 364/424.01
5,432,025 A 7/1995 Cox ........ 429/65
5,432,426 A 7/1995 Yoshida ........ 320/160
5,432,429 A 7/1995 Armstrong, II et al.
5,434,495 A 7/1995 Toko ........ 320/135
5,435,185 A 7/1995 Eagan ........ 73/587
5,442,274 A 8/1995 Tamai ........ 320/146
5,445,026 A 8/1995 Eagan ........ 73/591
5,449,996 A 9/1995 Matsumoto et al. ........ 320/148
5,449,997 A 9/1995 Gilmore et al. ........ 320/148
5,451,881 A 9/1995 Finger ........ 324/433
5,453,027 A 9/1995 Buell et al. ........ 439/433
5,457,377 A 10/1995 Jonsson ........ 324/430
5,459,660 A 10/1995 Berra ........ 701/33
5,462,439 A 10/1995 Keith ........ 180/279
5,469,043 A 11/1995 Cherng et al. ........ 320/161
5,485,090 A 1/1996 Stephens ........ 324/433
5,486,123 A 1/1996 Miyazaki ........ 439/825
5,488,300 A 1/1996 Jamieson ........ 324/432
5,504,674 A 4/1996 Chen et al. ........ 705/4
5,508,599 A 4/1996 Koenck ........ 320/138
5,519,383 A 5/1996 De La Rosa ........ 340/636.15
5,528,148 A 6/1996 Rogers ........ 320/137
5,537,967 A 7/1996 Tashiro et al. ........ 123/192.1
5,541,489 A 7/1996 Dunstan ........ 320/134
5,546,317 A 8/1996 Andrieu ........ 702/63
5,548,273 A 8/1996 Nicol et al. ........ 340/439
5,550,485 A 8/1996 Falk ........ 324/772
5,555,498 A 9/1996 Berra
5,561,380 A 10/1996 Sway-Tin et al. ........ 324/509
5,562,501 A 10/1996 Kinoshita et al. ........ 439/852
5,563,496 A 10/1996 McClure ........ 320/128
5,572,136 A 11/1996 Champlin ........ 324/426
5,573,611 A 11/1996 Koch et al. ........ 152/152.1
5,574,355 A 11/1996 McShane et al. ........ 320/161
5,578,915 A 11/1996 Crouch, Jr. et al. ........ 324/428
5,583,416 A 12/1996 Klang ........ 320/160
5,585,416 A 12/1996 Audett et al. ........ 522/35
5,585,728 A 12/1996 Champlin ........ 324/427
5,589,292 A 12/1996 Rozon
5,589,757 A 12/1996 Klang ........ 320/160
5,592,093 A 1/1997 Klingbiel ........ 324/426
5,592,094 A 1/1997 Ichikawa ........ 324/427
5,596,260 A 1/1997 Moravec et al. ........ 320/135
5,596,261 A 1/1997 Suyama ........ 320/152
5,598,098 A 1/1997 Champlin ........ 324/430
5,602,462 A 2/1997 Stich et al. ........ 323/258
5,606,242 A 2/1997 Hull et al. ........ 320/106
5,614,788 A 3/1997 Mullins et al. ........ 315/82
5,621,298 A 4/1997 Harvey ........ 320/134
5,631,536 A 5/1997 Tseng ........ 320/15
5,631,831 A 5/1997 Bird et al. ........ 701/34.4
5,633,985 A 5/1997 Severson et al. ........ 704/267
5,637,978 A 6/1997 Kellett et al. ........ 320/104
5,642,031 A 6/1997 Brotto ........ 320/156
5,644,212 A 7/1997 Takahashi ........ 320/134
5,650,937 A 7/1997 Bounaga ........ 702/65
5,652,501 A 7/1997 Mcclure et al. ........ 340/636.15
5,653,659 A 8/1997 Kunibe et al. ........ 477/111
5,654,623 A 8/1997 Shiga et al. ........ 320/106
5,656,920 A 8/1997 Cherng et al. ........ 324/431
5,661,368 A 8/1997 Deol et al. ........ 315/82
5,666,040 A 9/1997 Bourbeau ........ 320/118
5,675,234 A 10/1997 Greene ........ 340/636.11
5,677,077 A 10/1997 Faulk ........ 429/90
5,684,678 A 11/1997 Barrett ........ 363/17
5,685,734 A 11/1997 Kutz ........ 439/371
5,691,621 A 11/1997 Phuoc et al. ........ 320/134
5,699,050 A 12/1997 Kanazawa ........ 340/636.13
5,701,089 A 12/1997 Perkins ........ 324/772
5,705,929 A 1/1998 Caravello et al. ........ 324/430
5,707,015 A 1/1998 Guthrie ........ 241/120
5,710,503 A 1/1998 Sideris et al. ........ 320/116
5,711,648 A 1/1998 Hammerslag ........ 414/800
5,712,795 A 1/1998 Layman et al. ........ 700/297

(56) References Cited

U.S. PATENT DOCUMENTS 5,717,336 A 2/1998 Basell et al. .................. 324/430
5,717,937 A 2/1998 Fritz ............................ 713/300
5,721,688 A 2/1998 Bramwell ..................... 324/426
5,732,074 A 3/1998 Spaur et al. .................. 370/313
5,739,667 A 4/1998 Matsuda et al. .............. 320/128
5,744,962 A 4/1998 Alber et al. .................. 324/426
5,745,044 A 4/1998 Hyatt, Jr. et al. ............ 340/5.23
5,747,189 A 5/1998 Perkins .......................... 429/91
5,747,909 A 5/1998 Syverson et al. ........ 310/156.56
5,747,967 A 5/1998 Muljadi et al. ............... 320/148
5,754,417 A 5/1998 Nicollini ......................... 363/60
5,757,192 A 5/1998 McShane et al. ............ 324/427
5,760,587 A 6/1998 Harvey ......................... 324/434
5,772,468 A 6/1998 Kowalski et al. ............ 439/506
5,773,962 A 6/1998 Nor .............................. 320/134
5,773,978 A 6/1998 Becker .......................... 324/430
5,778,326 A 7/1998 Moroto et al. .................. 701/22
5,780,974 A 7/1998 Pabla et al. ..................... 315/82
5,780,980 A 7/1998 Naito ........................... 318/139
5,789,899 A 8/1998 van Phuoc et al. .......... 320/112
5,793,359 A 8/1998 Ushikubo ..................... 345/169
5,796,239 A 8/1998 van Phuoc et al. .......... 320/107
5,808,469 A 9/1998 Kopera ......................... 324/434
5,811,979 A 9/1998 Rhein ........................... 324/718
5,818,201 A 10/1998 Stockstad et al. ............ 320/119
5,818,234 A 10/1998 McKinnon .................... 324/433
5,820,407 A 10/1998 Morse et al. ................. 439/504
5,821,756 A 10/1998 McShane et al. ............ 324/430
5,821,757 A 10/1998 Alvarez et al. ............... 324/434
5,825,174 A 10/1998 Parker .......................... 324/106
5,826,467 A 10/1998 Huang
5,831,435 A 11/1998 Troy ............................ 324/426
5,832,396 A 11/1998 Moroto et al. .................. 701/22
5,850,113 A 12/1998 Weimer et al. ............... 307/125
5,862,515 A 1/1999 Kobayashi et al. ............ 702/63
5,865,638 A 2/1999 Trafton ......................... 439/288
5,869,951 A 2/1999 Takahashi ..................... 320/104
5,870,018 A 2/1999 Person ......................... 307/10.2
5,871,858 A 2/1999 Thomsen et al. ................. 429/7
5,872,443 A 2/1999 Williamson .................. 320/160
5,872,453 A 2/1999 Shimoyama et al. ........ 324/431
5,883,306 A 3/1999 Hwang ........................ 73/146.8
5,884,202 A 3/1999 Arjomand .................... 701/31.4
5,894,222 A 4/1999 Hibino
5,895,440 A 4/1999 Proctor et al. .................. 702/63
5,903,154 A 5/1999 Zhang et al. ................. 324/437
5,903,716 A 5/1999 Kimber et al. ............... 395/114
5,912,534 A 6/1999 Benedict ......................... 315/82
5,914,605 A 6/1999 Bertness ....................... 324/430
5,916,287 A 6/1999 Arjomand et al. .......... 701/33.2
5,927,938 A 7/1999 Hammerslag ................. 414/809
5,929,609 A 7/1999 Joy et al. ........................ 322/25
5,935,180 A 8/1999 Fieramosca et al. ........ 701/29.6
5,939,855 A 8/1999 Proctor et al. ................ 320/104
5,939,861 A 8/1999 Joko et al. .................... 320/122
5,945,829 A 8/1999 Bertness ....................... 324/430
5,946,605 A 8/1999 Takahisa et al. ............... 455/68
5,950,144 A 9/1999 Hall et al. ..................... 702/108
5,951,229 A 9/1999 Hammerslag ................. 414/398
5,953,322 A 9/1999 Kimball ........................ 370/328
5,955,951 A 9/1999 Wischerop et al. ....... 340/572.8
5,961,561 A 10/1999 Wakefield, II .................. 701/29
5,961,604 A 10/1999 Anderson et al. ............ 709/229
5,963,012 A 10/1999 Garcia et al. ................. 320/106
5,969,625 A 10/1999 Russo ...................... 340/636.19
5,973,598 A 10/1999 Beigel ........................ 340/572.1
5,978,805 A 11/1999 Carson ........................... 707/10
5,982,138 A 11/1999 Krieger ......................... 320/105
5,990,664 A 11/1999 Rahman ........................ 320/136
6,002,238 A 12/1999 Champlin ..................... 320/134
6,005,489 A 12/1999 Siegle et al. ............. 340/825.69
6,005,759 A 12/1999 Hart et al. ...................... 361/66
6,008,652 A 12/1999 Theofanopoulos et al. .. 324/434
6,009,369 A 12/1999 Boisvert et al. ................ 701/99
6,009,742 A 1/2000 Balko
6,016,047 A 1/2000 Notten et al. ................. 320/137
6,031,354 A 2/2000 Wiley et al. .................. 320/116
6,031,368 A 2/2000 Klippel et al. ................ 324/133
6,037,745 A 3/2000 Koike et al. .................. 320/104
6,037,749 A 3/2000 Parsonage ..................... 320/132
6,037,751 A 3/2000 Klang ........................... 320/160
6,037,777 A 3/2000 Champlin ..................... 324/430
6,037,778 A 3/2000 Makhija ........................ 324/433
6,046,514 A 4/2000 Rouillard et al. .............. 307/77
6,051,976 A 4/2000 Bertness ....................... 324/426
6,055,468 A 4/2000 Kaman et al. .................. 701/29
6,061,638 A 5/2000 Joyce ............................. 702/63
6,064,372 A 5/2000 Kahkoska ..................... 345/173
6,072,299 A 6/2000 Kurle et al. .................. 320/112
6,072,300 A 6/2000 Tsuji ............................ 320/116
6,075,339 A 6/2000 Reipur et al. ................ 320/110
6,076,018 A 6/2000 Sturman et al.
6,081,098 A 6/2000 Bertness et al. .............. 320/134
6,081,109 A 6/2000 Seymour et al. ............. 324/127
6,081,154 A 6/2000 Ezell et al. ................... 327/540
6,087,815 A 7/2000 Pfeifer et al. ................ 323/282
6,091,238 A 7/2000 McDermott ............... 324/207.2
6,091,245 A 7/2000 Bertness ....................... 324/426
6,094,030 A 7/2000 Gimthorpe et al.
6,094,033 A 7/2000 Ding et al. .................... 320/132
6,097,193 A 8/2000 Bramwell ..................... 324/429
6,100,670 A 8/2000 Levesque ...................... 320/150
6,100,815 A 8/2000 Pailthorp ................. 324/754.07
6,104,167 A 8/2000 Bertness et al. .............. 320/132
6,113,262 A 9/2000 Purola et al. ................... 374/45
6,114,834 A 9/2000 Parise ........................... 320/109
6,118,252 A 9/2000 Richter
6,121,880 A 9/2000 Scott et al. ................ 340/572.5
6,130,519 A 10/2000 Whiting et al.
6,136,914 A 10/2000 Hergenrother et al. ...... 524/495
6,137,261 A 10/2000 Kurle et al.
6,137,269 A 10/2000 Champlin ..................... 320/150
6,140,797 A 10/2000 Dunn ............................ 320/105
6,141,608 A 10/2000 Rother ......................... 701/29.6
6,144,185 A 11/2000 Dougherty et al. .......... 320/132
6,147,598 A 11/2000 Murphy et al. .......... 340/426.19
6,149,653 A 11/2000 Deslauriers ................... 606/232
6,150,793 A 11/2000 Lesesky et al. .............. 320/104
6,158,000 A 12/2000 Collins ............................. 713/1
6,161,640 A 12/2000 Yamaguchi .................. 180/65.8
6,163,156 A 12/2000 Bertness ....................... 324/426
6,164,063 A 12/2000 Mendler ......................... 60/274
6,167,349 A 12/2000 Alvarez .......................... 702/63
6,172,483 B1 1/2001 Champlin ..................... 320/134
6,172,505 B1 1/2001 Bertness ....................... 324/430
6,177,737 B1 1/2001 Palfey et al. ................... 307/64
6,177,878 B1 1/2001 Tamura
6,181,545 B1 1/2001 Amatucci et al. ............ 361/502
6,184,655 B1 2/2001 Malackowski ............... 320/116
6,184,656 B1 2/2001 Karunasiri et al. ........... 320/119
6,191,557 B1 2/2001 Gray et al. .................... 320/132
6,202,739 B1 3/2001 Pal et al. ................. 165/104.33
6,211,651 B1 4/2001 Nemoto ........................ 320/133
6,211,653 B1 4/2001 Stasko .......................... 320/132
6,215,275 B1 4/2001 Bean ............................ 320/106
6,218,805 B1 4/2001 Melcher ........................ 320/105
6,218,936 B1 4/2001 Imao ............................ 340/447
6,222,342 B1 4/2001 Eggert et al. ................. 320/105
6,222,369 B1 4/2001 Champlin ..................... 324/430
D442,503 S 5/2001 Lundbeck et al. ............. D10/77
6,225,808 B1 5/2001 Varghese et al. ............. 324/426
6,225,898 B1 5/2001 Kamiya et al. ............... 340/505
6,236,186 B1 5/2001 Helton et al. ................. 320/106
6,236,332 B1 5/2001 Conkright et al. ............ 340/3.1
6,236,949 B1 5/2001 Hart ............................... 702/64
6,238,253 B1 5/2001 Qualls .......................... 439/759
6,242,887 B1 6/2001 Burke ........................... 320/104
6,242,921 B1 6/2001 Thibedeau et al. ........... 324/429
6,249,124 B1 6/2001 Bertness ....................... 324/426
6,250,973 B1 6/2001 Lowery et al. ............... 439/763
6,252,942 B1 6/2001 Zoiss ............................. 379/19
6,254,438 B1 7/2001 Gaunt ........................... 439/755
6,255,826 B1 7/2001 Ohsawa ........................ 320/116
6,259,170 B1 7/2001 Limoge et al. .............. 307/10.8

(56) References Cited

U.S. PATENT DOCUMENTS

| | | | | |
|---|---|---|---|---|
| 6,259,254 | B1 | 7/2001 | Klang | 324/427 |
| 6,262,563 | B1 | 7/2001 | Champlin | 320/134 |
| 6,262,692 | B1 | 7/2001 | Babb | 343/895 |
| 6,263,268 | B1 | 7/2001 | Nathanson | 701/29 |
| 6,263,322 | B1 | 7/2001 | Kirkevold et al. | 705/400 |
| 6,271,643 | B1 | 8/2001 | Becker et al. | 320/112 |
| 6,271,748 | B1 | 8/2001 | Derbyshire et al. | 340/442 |
| 6,272,387 | B1 | 8/2001 | Yoon | 700/83 |
| 6,275,008 | B1 | 8/2001 | Arai et al. | 320/132 |
| 6,285,191 | B1 | 9/2001 | Gollomp et al. | 324/427 |
| 6,294,896 | B1 | 9/2001 | Champlin | 320/134 |
| 6,294,897 | B1 | 9/2001 | Champlin | 320/153 |
| 6,304,087 | B1 | 10/2001 | Bertness | 324/426 |
| 6,307,349 | B1 | 10/2001 | Koenck et al. | 320/112 |
| 6,310,481 | B2 | 10/2001 | Bertness | 324/430 |
| 6,313,607 | B1 | 11/2001 | Champlin | 320/132 |
| 6,313,608 | B1 | 11/2001 | Varghese et al. | 320/132 |
| 6,316,914 | B1 | 11/2001 | Bertness | 320/134 |
| 6,320,385 | B1 | 11/2001 | Ng et al. | 320/104 |
| 6,323,650 | B1 | 11/2001 | Bertness et al. | 324/426 |
| 6,324,042 | B1 | 11/2001 | Andrews | 361/93.2 |
| 6,329,793 | B1 | 12/2001 | Bertness et al. | 320/132 |
| 6,331,762 | B1 | 12/2001 | Bertness | 320/134 |
| 6,332,113 | B1 | 12/2001 | Bertness | 702/63 |
| 6,346,795 | B2 | 2/2002 | Haraguchi et al. | 320/136 |
| 6,347,958 | B1 | 2/2002 | Tsai | 439/488 |
| 6,351,102 | B1 | 2/2002 | Troy | 320/139 |
| 6,356,042 | B1 | 3/2002 | Kahlon et al. | 318/138 |
| 6,356,083 | B1 | 3/2002 | Ying | 324/426 |
| 6,359,441 | B1 | 3/2002 | Bertness | 324/426 |
| 6,359,442 | B1 | 3/2002 | Henningson et al. | 324/426 |
| 6,363,303 | B1 | 3/2002 | Bertness | 701/29 |
| RE37,677 | E | 4/2002 | Irie | 315/83 |
| 6,377,031 | B1 | 4/2002 | Karuppana et al. | 323/220 |
| 6,384,608 | B1 | 5/2002 | Namaky | 324/430 |
| 6,388,448 | B1 | 5/2002 | Cervas | 324/426 |
| 6,389,337 | B1 | 5/2002 | Kolls | 701/31.6 |
| 6,392,414 | B2 | 5/2002 | Bertness | 324/429 |
| 6,396,278 | B1 | 5/2002 | Makhija | 324/402 |
| 6,407,554 | B1 | 6/2002 | Godau et al. | 324/503 |
| 6,411,098 | B1 | 6/2002 | Laletin | 324/436 |
| 6,417,669 | B1 | 7/2002 | Champlin | 324/426 |
| 6,420,852 | B1 | 7/2002 | Sato | 320/134 |
| 6,424,157 | B1 | 7/2002 | Gollomp et al. | 324/430 |
| 6,424,158 | B2 | 7/2002 | Klang | 324/433 |
| 6,426,606 | B1 | 7/2002 | Purkey | |
| 6,433,512 | B1 | 8/2002 | Birkler et al. | 320/132 |
| 6,437,957 | B1 | 8/2002 | Karuppana et al. | 361/78 |
| 6,441,585 | B1 | 8/2002 | Bertness | 320/132 |
| 6,445,158 | B1 | 9/2002 | Bertness et al. | 320/104 |
| 6,448,778 | B1 | 9/2002 | Rankin | 324/503 |
| 6,449,726 | B1 | 9/2002 | Smith | 713/340 |
| 6,456,036 | B1 | 9/2002 | Thandiwe | 320/106 |
| 6,456,045 | B1 | 9/2002 | Troy et al. | 320/139 |
| 6,465,908 | B1 | 10/2002 | Karuppana et al. | 307/31 |
| 6,466,025 | B1 | 10/2002 | Klang | 324/429 |
| 6,466,026 | B1 | 10/2002 | Champlin | 324/430 |
| 6,469,511 | B1 | 10/2002 | Vonderhaar et al. | 324/425 |
| 6,473,659 | B1 | 10/2002 | Shah et al. | 700/79 |
| 6,477,478 | B1 | 11/2002 | Jones et al. | 702/102 |
| 6,495,990 | B2 | 12/2002 | Champlin | 320/132 |
| 6,497,209 | B1 | 12/2002 | Karuppana et al. | 123/179.3 |
| 6,500,025 | B1 | 12/2002 | Moenkhaus et al. | 439/502 |
| 6,501,243 | B1 | 12/2002 | Kaneko | 318/139 |
| 6,505,507 | B1 | 1/2003 | Imao | 73/146.5 |
| 6,507,196 | B2 | 1/2003 | Thomsen et al. | 324/436 |
| 6,526,361 | B1 | 2/2003 | Jones et al. | 702/63 |
| 6,529,723 | B1 | 3/2003 | Bentley | 455/405 |
| 6,531,847 | B1 | 3/2003 | Tsukamoto et al. | |
| 6,531,848 | B1 | 3/2003 | Chitsazan et al. | 320/153 |
| 6,532,425 | B1 | 3/2003 | Boost et al. | 702/63 |
| 6,533,316 | B2 | 3/2003 | Breed et al. | 280/735 |
| 6,534,992 | B2 | 3/2003 | Meissner et al. | 324/426 |
| 6,534,993 | B2 | 3/2003 | Bertness | 324/433 |
| 6,536,536 | B1 | 3/2003 | Gass et al. | 173/2 |
| 6,544,078 | B2 | 4/2003 | Palmisano et al. | 439/762 |
| 6,545,599 | B2 | 4/2003 | Derbyshire et al. | 340/442 |
| 6,556,019 | B2 | 4/2003 | Bertness | 324/426 |
| 6,566,883 | B1 | 5/2003 | Vonderhaar et al. | 324/426 |
| 6,570,385 | B1 | 5/2003 | Roberts et al. | 324/378 |
| 6,573,685 | B2 | 6/2003 | Nakanishi et al. | |
| 6,577,107 | B2 | 6/2003 | Kechmire | 320/139 |
| 6,586,941 | B2 | 7/2003 | Bertness et al. | 324/426 |
| 6,597,150 | B1 | 7/2003 | Bertness et al. | 320/104 |
| 6,599,243 | B2 | 7/2003 | Woltermann et al. | 600/300 |
| 6,600,815 | B1 | 7/2003 | Walding | 379/93.07 |
| 6,611,740 | B2 | 8/2003 | Lowrey et al. | 701/29 |
| 6,614,349 | B1 | 9/2003 | Proctor et al. | 340/572.1 |
| 6,618,644 | B2 | 9/2003 | Bean | 700/231 |
| 6,621,272 | B2 | 9/2003 | Champlin | 324/426 |
| 6,623,314 | B1 | 9/2003 | Cox et al. | 439/759 |
| 6,624,635 | B1 | 9/2003 | Lui | 324/426 |
| 6,628,011 | B2 | 9/2003 | Droppo et al. | 307/43 |
| 6,629,054 | B2 | 9/2003 | Makhija et al. | 702/113 |
| 6,633,165 | B2 | 10/2003 | Bertness | 324/426 |
| 6,635,974 | B1 | 10/2003 | Karuppana et al. | 307/140 |
| 6,636,790 | B1 | 10/2003 | Lightner et al. | 701/31.5 |
| 6,667,624 | B1 | 12/2003 | Raichle et al. | 324/522 |
| 6,679,212 | B2 | 1/2004 | Kelling | 123/179.28 |
| 6,686,542 | B2 | 2/2004 | Zhang | 174/74 |
| 6,696,819 | B2 | 2/2004 | Bertness | 320/134 |
| 6,707,303 | B2 | 3/2004 | Bertness et al. | 324/426 |
| 6,732,031 | B1 | 5/2004 | Lightner et al. | 701/31.4 |
| 6,736,941 | B2 | 5/2004 | Oku et al. | 203/68 |
| 6,737,831 | B2 | 5/2004 | Champlin | 320/132 |
| 6,738,697 | B2 | 5/2004 | Breed | 701/29 |
| 6,740,990 | B2 | 5/2004 | Tozuka et al. | 307/9.1 |
| 6,744,149 | B1 | 6/2004 | Karuppana et al. | 307/31 |
| 6,745,153 | B2 | 6/2004 | White et al. | 702/184 |
| 6,759,849 | B2 | 7/2004 | Bertness | 324/426 |
| 6,771,073 | B2 | 8/2004 | Henningson et al. | 324/426 |
| 6,777,945 | B2 | 8/2004 | Roberts et al. | 324/426 |
| 6,781,344 | B1 | 8/2004 | Hedegor et al. | 320/106 |
| 6,781,382 | B2 | 8/2004 | Johnson | 324/426 |
| 6,784,635 | B2 | 8/2004 | Larson | 320/104 |
| 6,784,637 | B2 | 8/2004 | Raichle et al. | 320/107 |
| 6,788,025 | B2 | 9/2004 | Bertness et al. | 320/104 |
| 6,795,782 | B2 | 9/2004 | Bertness et al. | 702/63 |
| 6,796,841 | B1 | 9/2004 | Cheng et al. | 439/620.3 |
| 6,805,090 | B2 | 10/2004 | Bertness et al. | 123/198 |
| 6,806,716 | B2 | 10/2004 | Bertness et al. | 324/426 |
| 6,825,669 | B2 | 11/2004 | Raichle et al. | 324/426 |
| 6,832,141 | B2 | 12/2004 | Skeen et al. | 701/31.4 |
| 6,842,707 | B2 | 1/2005 | Raichle et al. | 702/62 |
| 6,845,279 | B1 | 1/2005 | Gilmore et al. | 700/115 |
| 6,850,037 | B2 | 2/2005 | Bertness | 320/132 |
| 6,856,162 | B1 | 2/2005 | Greatorex et al. | 324/764.01 |
| 6,856,972 | B1 | 2/2005 | Yun et al. | 705/36 R |
| 6,871,151 | B2 | 3/2005 | Bertness | 702/63 |
| 6,885,195 | B2 | 4/2005 | Bertness | 324/426 |
| 6,888,468 | B2 | 5/2005 | Bertness | 340/636.15 |
| 6,891,378 | B2 | 5/2005 | Bertness et al. | 324/426 |
| 6,895,809 | B2 | 5/2005 | Raichle | 73/119 |
| 6,904,796 | B2 | 6/2005 | Pacsai et al. | 73/146.8 |
| 6,906,522 | B2 | 6/2005 | Bertness et al. | 324/426 |
| 6,906,523 | B2 | 6/2005 | Bertness et al. | 324/426 |
| 6,906,624 | B2 | 6/2005 | McClelland et al. | 340/442 |
| 6,909,287 | B2 | 6/2005 | Bertness | 324/427 |
| 6,909,356 | B2 | 6/2005 | Brown et al. | 340/3.2 |
| 6,911,825 | B2 | 6/2005 | Namaky | 324/426 |
| 6,913,483 | B2 | 7/2005 | Restaino et al. | 439/504 |
| 6,914,413 | B2 | 7/2005 | Bertness et al. | 320/104 |
| 6,919,725 | B2 | 7/2005 | Bertness et al. | 324/433 |
| 6,930,485 | B2 | 8/2005 | Bertness et al. | 324/426 |
| 6,933,727 | B2 | 8/2005 | Bertness et al. | 324/426 |
| 6,941,234 | B2 | 9/2005 | Bertness et al. | 702/63 |
| 6,957,133 | B1 | 10/2005 | Hunt et al. | 701/32.4 |
| 6,961,445 | B1 | 11/2005 | Jensen et al. | |
| 6,967,484 | B2 | 11/2005 | Bertness | 324/426 |
| 6,972,662 | B1 | 12/2005 | Ohkawa et al. | 340/10.1 |
| 6,983,212 | B2 | 1/2006 | Burns | 702/63 |
| 6,988,053 | B2 | 1/2006 | Namaky | 320/104 |
| 6,993,421 | B2 | 1/2006 | Pillar et al. | 701/29.4 |
| 6,998,847 | B2 | 2/2006 | Bertness et al. | 324/426 |

(56) References Cited

U.S. PATENT DOCUMENTS 7,003,410 B2 2/2006 Bertness et al. ................ 702/63
7,003,411 B2 2/2006 Bertness .......................... 702/63
7,012,433 B2 3/2006 Smith et al. .................. 324/426
7,015,674 B2 3/2006 VonderHaar .................. 320/103
7,029,338 B1 4/2006 Orange et al. ................ 439/755
7,034,541 B2 4/2006 Bertness et al. .............. 324/426
7,039,533 B2 5/2006 Bertness et al. ................ 702/63
7,042,346 B2 5/2006 Paulsen ......................... 340/438
7,049,822 B2 5/2006 Kung ............................ 324/426
7,058,525 B2 6/2006 Bertness et al. ................ 702/63
7,069,979 B2 7/2006 Tobias ..................... 165/104.33
7,081,755 B2 7/2006 Klang et al. .................. 324/426
7,089,127 B2 8/2006 Thibedeau et al. ............. 702/63
7,098,666 B2 8/2006 Patino ........................... 324/433
7,102,556 B2 9/2006 White ........................... 341/141
7,106,070 B2 9/2006 Bertness et al. .............. 324/538
7,116,109 B2 10/2006 Klang ........................... 324/426
7,119,686 B2 10/2006 Bertness et al. ........... 340/572.1
7,120,488 B2 10/2006 Nova et al. ....................... 600/2
7,126,341 B2 10/2006 Bertness et al. .............. 324/426
7,129,706 B2 10/2006 Kalley .......................... 324/426
7,154,276 B2 12/2006 Bertness ....................... 324/503
7,170,393 B2 1/2007 Martin ......................... 340/10.1
7,173,182 B2 2/2007 Katsuyama ..................... 174/36
7,177,925 B2 2/2007 Carcido et al. ............... 709/223
7,182,147 B2 2/2007 Cutler et al. ...................... 173/1
7,184,866 B2 2/2007 Squires .................... 340/426.15
7,184,905 B2 2/2007 Stefan ............................ 702/63
7,198,510 B2 4/2007 Bertness ....................... 439/500
7,200,424 B2 4/2007 Tischer et al. ................ 455/567
7,202,636 B2 4/2007 Reynolds et al. ............ 320/166
7,208,914 B2 4/2007 Klang ........................... 320/132
7,209,850 B2 4/2007 Brott et al. ................... 324/426
7,209,860 B2 4/2007 Trsar et al. ................... 702/183
7,212,887 B2 5/2007 Shah et al. .................... 700/276
7,212,911 B2 5/2007 Raichle et al. ............... 701/114
7,219,023 B2 5/2007 Banke et al. ................... 702/58
7,233,128 B2 6/2007 Brost et al. ................... 320/132
7,235,977 B2 6/2007 Koran et al. .................. 324/426
7,246,015 B2 7/2007 Bertness et al. ................ 702/63
7,251,551 B2 7/2007 Mitsueda .......................... 700/2
7,272,519 B2 9/2007 Lesesky et al. ................ 702/63
7,287,001 B1 10/2007 Falls et al. ...................... 705/22
7,295,936 B2 11/2007 Bertness et al. ................ 702/63
7,301,303 B1 11/2007 Hulden ......................... 320/103
7,319,304 B2 1/2008 Veloo et al. .................. 320/134
7,339,477 B2 3/2008 Puzio et al. ............... 340/572.1
7,363,175 B2 4/2008 Bertness et al. ................ 702/63
7,376,497 B2 5/2008 Chen ............................ 701/31.6
7,398,176 B2 7/2008 Bertness ....................... 702/140
7,408,358 B2 8/2008 Knopf ........................... 324/426
7,417,437 B1 8/2008 Torres
7,425,833 B2 9/2008 Bertness et al. .............. 324/426
7,446,536 B2 11/2008 Bertness ....................... 324/426
7,453,238 B2 11/2008 Melichar ....................... 320/132
7,479,763 B2 1/2009 Bertness ....................... 320/134
7,498,767 B2 3/2009 Brown et al. ................. 320/107
7,501,795 B2 3/2009 Bertness et al. .............. 320/134
7,504,830 B2 3/2009 Keuss
7,505,856 B2 3/2009 Restaino et al. ................ 702/63
7,538,571 B2 5/2009 Raichle et al. ............... 324/772
7,545,146 B2 6/2009 Klang et al. .................. 324/426
7,557,586 B1 7/2009 Vonderhaar et al. ......... 324/437
7,571,035 B2 8/2009 Raichle
7,590,476 B2 9/2009 Shumate ...................... 701/31.6
7,592,776 B2 9/2009 Tsukamoto et al. .......... 320/136
7,595,643 B2 9/2009 Klang ........................... 324/426
7,596,437 B1 9/2009 Hunt et al.
7,598,699 B2 10/2009 Restaino et al. .............. 320/105
7,598,743 B2 10/2009 Bertness ....................... 324/426
7,598,744 B2 10/2009 Bertness et al. .............. 324/426
7,619,417 B2 11/2009 Klang ........................... 324/427
7,642,786 B2 1/2010 Philbrook ..................... 324/426
7,642,787 B2 1/2010 Bertness et al. .............. 324/426
7,656,162 B2 2/2010 Vonderhaar et al. ......... 324/426
7,657,386 B2 2/2010 Thibedeau et al. ............. 702/63
7,667,437 B2 2/2010 Johnson et al. .............. 320/150
7,679,325 B2 3/2010 Seo .............................. 320/116
7,684,908 B1 3/2010 Ogilvie et al. ............... 701/29.6
7,688,074 B2 3/2010 Cox et al. ..................... 324/426
7,690,573 B2 4/2010 Raichle et al. ............... 235/462
7,696,759 B2 4/2010 Raichle et al. ............... 324/538
7,698,179 B2 4/2010 Leung et al. ................... 705/28
7,705,602 B2 4/2010 Bertness ....................... 324/426
7,706,991 B2 4/2010 Bertness et al. ................ 702/63
7,706,992 B2 4/2010 Ricci et al.
7,710,119 B2 5/2010 Bertness ....................... 324/426
7,723,993 B2 5/2010 Klang ........................... 324/431
7,728,556 B2 6/2010 Yano et al. ................... 320/134
7,728,597 B2 6/2010 Bertness ....................... 324/426
7,729,880 B1 6/2010 Mashburn ..................... 702/151
7,743,788 B2 6/2010 Schmitt ......................... 137/554
7,751,953 B2 7/2010 Namaky ...................... 701/33.2
7,772,850 B2 8/2010 Bertness ....................... 324/426
7,774,130 B2 8/2010 Pepper .......................... 340/439
7,774,151 B2 8/2010 Bertness ......................... 702/63
7,777,612 B2 8/2010 Sampson et al. .......... 340/426.1
7,791,348 B2 9/2010 Brown et al. ................. 324/426
7,797,995 B2 9/2010 Schaefer
7,808,375 B2 10/2010 Bertness et al. .............. 340/455
7,848,857 B2 12/2010 Nasr et al. ...................... 701/22
7,883,002 B2 2/2011 Jin et al. ....................... 235/376
7,902,990 B2 3/2011 Delmonico et al. ....... 340/636.1
7,914,350 B1 3/2011 Bozich .......................... 439/506
7,924,015 B2 4/2011 Bertness ....................... 324/427
7,940,052 B2 5/2011 Vonderhaar
7,940,053 B2 5/2011 Brown et al. ................. 324/426
7,959,476 B2 6/2011 Smith et al.
7,977,914 B2 7/2011 Bertness
D643,759 S 8/2011 Bertness
7,990,155 B2 8/2011 Henningson .................. 324/429
7,999,505 B2 8/2011 Bertness ....................... 320/104
8,024,083 B2 9/2011 Chenn .............................. 701/2
8,047,868 B1 11/2011 Korcynski .................... 439/522
8,164,343 B2 4/2012 Bertness ....................... 324/503
8,198,900 B2 6/2012 Bertness et al.
8,203,345 B2 6/2012 Bertness
8,222,868 B2 7/2012 Buckner ....................... 320/136
8,226,008 B2 7/2012 Raichle et al. .......... 235/462.13
8,237,448 B2 8/2012 Bertness
8,306,690 B2 11/2012 Bertness ...................... 701/34.4
8,310,271 B2 11/2012 Raichle et al. .......... 324/765.01
8,344,685 B2 1/2013 Bertness et al.
8,436,619 B2 5/2013 Bertness et al.
8,442,877 B2 5/2013 Bertness et al.
8,449,560 B2 5/2013 Roth .......................... 227/175.1
8,493,022 B2 7/2013 Bertness
D687,727 S 8/2013 Kehoe et al.
8,509,212 B2 8/2013 Sanjeev
8,513,949 B2 8/2013 Bertness
8,594,957 B2 11/2013 Gauthier ....................... 324/548
8,674,654 B2 3/2014 Bertness
8,674,711 B2 3/2014 Bertness
8,704,483 B2 4/2014 Bertness et al.
8,738,309 B2 5/2014 Bertness
8,754,653 B2 6/2014 Volderhaar et al.
8,810,200 B2 8/2014 Kondo
8,825,272 B1 9/2014 Chinnadurai
8,827,729 B2 9/2014 Gunreben ..................... 439/188
8,872,516 B2 10/2014 Bertness
8,872,517 B2 10/2014 Philbrook et al.
8,901,888 B1 12/2014 Beckman
8,958,998 B2 2/2015 Bertness
8,963,550 B2 2/2015 Bertness et al.
9,018,958 B2 4/2015 Bertness
9,037,394 B2 5/2015 Fernandes ..................... 701/400
9,052,366 B2 6/2015 Bertness
9,056,556 B1 6/2015 Hyde et al.
9,166,261 B2 10/2015 Ibi
9,201,120 B2 12/2015 Stukenburg
9,229,062 B2 1/2016 Stukenberg
9,244,100 B2 1/2016 Coleman et al.
9,255,955 B2 2/2016 Bertness ....................... 324/503
9,274,157 B2 3/2016 Bertness

(56) References Cited

U.S. PATENT DOCUMENTS 9,312,575 B2 4/2016 Stukenberg
9,335,362 B2 5/2016 Bertness
9,419,311 B2 8/2016 Bertness
9,425,487 B2 8/2016 Bertness
9,496,720 B2 11/2016 McShane
9,588,185 B2 3/2017 Champlin
9,639,899 B1 5/2017 Gersitz
9,923,289 B2 3/2018 Bertness
9,966,676 B2 5/2018 Salo, III et al.
10,046,649 B2 8/2018 Bertness
10,222,397 B2 3/2019 Salo et al.
10,317,468 B2 6/2019 Bertness
10,429,449 B2 10/2019 Arnoldus
10,473,555 B2 11/2019 Bertness
10,525,841 B2 1/2020 Zhou et al.
10,536,007 B2 1/2020 Beaston
10,608,353 B2 3/2020 Lipkin et al.
10,843,574 B2 11/2020 Palmisano et al.
11,054,480 B2 7/2021 Bertness
11,325,479 B2 5/2022 Bertness
11,474,153 B2 10/2022 Salo, III et al.
11,486,930 B2 11/2022 Salo, III et al.
11,513,160 B2 11/2022 Salo, III et al.
11,545,839 B2 1/2023 Sampson et al.
11,548,404 B2 1/2023 Bertness
11,566,972 B2 1/2023 Sampson et al.
11,650,259 B2 5/2023 Bertness
11,668,779 B2 6/2023 Bertness
11,740,294 B2 8/2023 Bertness
11,745,593 B1 9/2023 Awad Alla
11,926,224 B2 3/2024 Bertness
11,973,202 B2 4/2024 Bertness
12,070,847 B1 * 8/2024 Ebrahimi Afrouzi ........................ B25J 9/1684
12,148,938 B1 11/2024 Carroll
12,196,813 B2 1/2025 Bertness
12,237,482 B2 2/2025 Bertness
12,296,713 B2 5/2025 Ropel
12,517,178 B2 1/2026 Bertness
2001/0012738 A1 8/2001 Duperret ........................ 439/835
2001/0033169 A1 10/2001 Singh ........................ 324/426
2001/0035737 A1 11/2001 Nakanishi et al. ........... 320/122
2001/0048215 A1 12/2001 Breed et al. ............... 280/728.1
2001/0048226 A1 12/2001 Nada ........................ 290/40
2002/0003423 A1 1/2002 Bertness et al. .............. 324/426
2002/0004694 A1 1/2002 McLeod ........................ 701/29
2002/0007237 A1 1/2002 Phung et al. .................... 701/33
2002/0010558 A1 1/2002 Bertness et al. ................ 702/63
2002/0018927 A1 2/2002 Thomsen et al.
2002/0021135 A1 2/2002 Li et al. ........................ 324/677
2002/0027346 A1 3/2002 Breed et al. .................. 280/735
2002/0030495 A1 3/2002 Kechmire ..................... 324/427
2002/0036504 A1 3/2002 Troy et al. .................... 324/430
2002/0041175 A1 4/2002 Lauper et al. ................ 320/106
2002/0044050 A1 4/2002 Derbyshire et al. .......... 340/442
2002/0047711 A1 4/2002 Bertness et al. .............. 324/426
2002/0050163 A1 5/2002 Makhija et al. ................ 73/116
2002/0065619 A1 5/2002 Bertness ........................ 702/63
2002/0074398 A1 6/2002 Lancos et al. ................ 235/382
2002/0116140 A1 8/2002 Rider ........................ 702/63
2002/0118111 A1 8/2002 Brown et al. .............. 340/573.1
2002/0121877 A1 9/2002 Smith et al.
2002/0121901 A1 9/2002 Hoffman ........................ 324/426
2002/0128985 A1 9/2002 Greenwald ................... 705/400
2002/0130665 A1 9/2002 Bertness et al. .............. 324/426
2002/0152791 A1 10/2002 Cardinale
2002/0153864 A1 10/2002 Bertness ........................ 320/132
2002/0171428 A1 11/2002 Bertness ........................ 702/63
2002/0176010 A1 11/2002 Wallach et al. ............... 348/362
2002/0193955 A1 12/2002 Bertness ........................ 702/63
2003/0006779 A1 1/2003 H. Youval ..................... 324/503
2003/0009270 A1 1/2003 Breed ........................ 701/29
2003/0017753 A1 1/2003 Palmisano et al. ........... 439/762
2003/0025481 A1 2/2003 Bertness ........................ 324/427
2003/0030442 A1 2/2003 Sugimoto ..................... 324/429
2003/0036909 A1 2/2003 Kato ........................ 704/275
2003/0038637 A1 2/2003 Bertness et al.
2003/0040873 A1 2/2003 Lesesky et al. ................ 702/57
2003/0060953 A1 3/2003 Chen ........................ 701/33
2003/0078743 A1 4/2003 Bertness et al. ................ 702/63
2003/0088375 A1 5/2003 Bertness et al. ................ 702/63
2003/0090272 A1 5/2003 Bertness ........................ 324/426
2003/0114206 A1 6/2003 Timothy .................... 455/575.7
2003/0124417 A1 7/2003 Bertness et al. ................ 429/90
2003/0128011 A1 7/2003 Bertness et al.
2003/0128036 A1 7/2003 Henningson et al. ........ 324/426
2003/0137277 A1 7/2003 Mori et al. .................... 320/132
2003/0155930 A1 8/2003 Thomsen
2003/0164073 A1 9/2003 Chen
2003/0169018 A1 9/2003 Berels et al. ................. 320/132
2003/0169019 A1 9/2003 Oosaki ........................ 320/132
2003/0171111 A1 9/2003 Clark ........................ 455/414.1
2003/0173971 A1 9/2003 Bertness ........................ 324/441
2003/0177417 A1 9/2003 Malhotra et al. ............... 714/42
2003/0184262 A1 10/2003 Makhija ........................ 320/156
2003/0184264 A1 10/2003 Bertness
2003/0184306 A1 10/2003 Bertness et al. .............. 324/426
2003/0187556 A1 10/2003 Suzuki ........................ 701/29
2003/0194672 A1 10/2003 Roberts et al. ............... 431/196
2003/0197512 A1 10/2003 Miller et al. .................. 324/426
2003/0212311 A1 11/2003 Nova et al. ................... 600/300
2003/0214395 A1 11/2003 Flowerday et al. .......... 340/445
2003/0224241 A1 12/2003 Takada et al. .................. 429/52
2003/0236656 A1 12/2003 Dougherty ...................... 703/14
2004/0000590 A1 1/2004 Raichle et al. .......... 235/462.01
2004/0000891 A1 1/2004 Raichle et al. ............... 320/107
2004/0000893 A1 1/2004 Raichle et al. ............... 320/135
2004/0000913 A1 1/2004 Raichle et al. ............... 324/426
2004/0000915 A1 1/2004 Raichle et al. ............... 324/522
2004/0002824 A1 1/2004 Raichle et al. ................. 702/63
2004/0002825 A1 1/2004 Raichle et al. ................. 702/63
2004/0002836 A1 1/2004 Raichle et al. ............... 702/188
2004/0032264 A1 2/2004 Schoch ........................ 324/426
2004/0036443 A1 2/2004 Bertness ........................ 320/109
2004/0044452 A1 3/2004 Bauer et al. .................... 703/33
2004/0044454 A1 3/2004 Ross et al. ...................... 701/33
2004/0046564 A1 3/2004 Klang ........................ 324/426
2004/0049361 A1 3/2004 Hamdan et al. .............. 702/115
2004/0051532 A1 3/2004 Smith et al. .................. 324/426
2004/0051533 A1 3/2004 Namaky ........................ 324/426
2004/0051534 A1 3/2004 Kobayashi et al. .......... 324/429
2004/0054503 A1 3/2004 Namaky ........................ 702/182
2004/0064225 A1 4/2004 Jammu et al. .................. 701/29
2004/0065489 A1 4/2004 Aberle ........................ 180/65.1
2004/0088087 A1 5/2004 Fukushima et al. ............ 701/32
2004/0090208 A1 5/2004 Almerich
2004/0104728 A1 6/2004 Bertness et al. .............. 324/429
2004/0108855 A1 6/2004 Raichle ........................ 324/378
2004/0108856 A1 6/2004 Johnson ........................ 324/426
2004/0113494 A1 6/2004 Karuppana et al.
2004/0113588 A1 6/2004 Mikuriya et al. ............. 320/128
2004/0145342 A1 7/2004 Lyon ........................ 320/108
2004/0145371 A1 7/2004 Bertness ........................ 324/426
2004/0150494 A1 8/2004 Yoshida ........................ 333/243
2004/0157113 A1 8/2004 Klang ........................ 429/50
2004/0164706 A1 8/2004 Osborne ........................ 320/116
2004/0172177 A1 9/2004 Nagai et al. .................... 701/29
2004/0178185 A1 9/2004 Yoshikawa et al. .......... 219/270
2004/0189309 A1 9/2004 Bertness et al. .............. 324/426
2004/0199343 A1 10/2004 Cardinal et al. ................ 702/63
2004/0207367 A1 10/2004 Taniguchi et al. ............ 320/149
2004/0212350 A1 10/2004 Patino et al.
2004/0221641 A1 11/2004 Moritsugu ................... 73/23.31
2004/0227523 A1 11/2004 Namaky ........................ 324/537
2004/0239332 A1 12/2004 Mackel et al. ................ 324/426
2004/0251876 A1 12/2004 Bertness et al. .............. 320/136
2004/0251907 A1 12/2004 Kalley
2004/0257084 A1 12/2004 Restaino ........................ 324/400
2005/0007068 A1 1/2005 Johnson et al. .............. 320/110
2005/0009122 A1 1/2005 Whelan et al. .............. 435/7.32
2005/0017726 A1 1/2005 Koran et al. .................. 324/433
2005/0017952 A1 1/2005 His ........................ 345/169
2005/0021197 A1 1/2005 Zimmerman ................ 701/31.4
2005/0021294 A1 1/2005 Trsar et al. ................... 702/183

(56) References Cited

U.S. PATENT DOCUMENTS

2005/0021475 A1 1/2005 Bertness ........ 705/63
2005/0025299 A1 2/2005 Tischer et al. ........ 379/199
2005/0035752 A1 2/2005 Bertness
2005/0043868 A1 2/2005 Mitcham ........ 701/29
2005/0057256 A1 3/2005 Bertness ........ 324/426
2005/0060070 A1 3/2005 Kapolka et al. ........ 701/29
2005/0073314 A1 4/2005 Bertness et al. ........ 324/433
2005/0076381 A1 4/2005 Gross ........ 725/107
2005/0077904 A1 4/2005 Bertness ........ 324/426
2005/0096809 A1 5/2005 Skeen et al. ........ 701/29
2005/0099185 A1 5/2005 Klang
2005/0102073 A1 5/2005 Ingram ........ 701/29
2005/0119809 A1 6/2005 Chen ........ 701/33.5
2005/0128083 A1 6/2005 Puzio et al. ........ 340/572.1
2005/0128902 A1 6/2005 Tsai ........ 369/44.32
2005/0133245 A1 6/2005 Katsuyama ........ 174/74 R
2005/0134282 A1 6/2005 Averbuch ........ 324/426
2005/0143882 A1 6/2005 Umezawa ........ 701/29
2005/0159847 A1 7/2005 Shah et al. ........ 700/276
2005/0162172 A1 7/2005 Bertness ........ 324/426
2005/0168226 A1 8/2005 Quint et al. ........ 324/426
2005/0173142 A1 8/2005 Cutler et al. ........ 173/181
2005/0182536 A1 8/2005 Doyle et al. ........ 701/29
2005/0184732 A1 8/2005 Restaino ........ 324/426
2005/0192045 A1 9/2005 Lowles
2005/0206346 A1 9/2005 Smith et al.
2005/0212521 A1 9/2005 Bertness et al. ........ 324/426
2005/0213874 A1 9/2005 Kline ........ 385/15
2005/0214144 A1 9/2005 Yoshida
2005/0218902 A1 10/2005 Restaino et al. ........ 324/433
2005/0231205 A1 10/2005 Bertness et al. ........ 324/426
2005/0254106 A9 11/2005 Silverbrook et al. ........ 358/539
2005/0256617 A1 11/2005 Cawthorne et al. ........ 701/22
2005/0258241 A1 11/2005 McNutt et al. ........ 235/385
2005/0264296 A1 12/2005 Philbrook ........ 324/433
2005/0269880 A1 12/2005 Konishi ........ 307/10.7
2005/0273218 A1 12/2005 Breed ........ 701/2
2006/0012330 A1 1/2006 Okumura et al. ........ 320/103
2006/0017447 A1 1/2006 Bertness ........ 324/538
2006/0026017 A1 2/2006 Walkder ........ 701/31.4
2006/0030980 A1 2/2006 St. Denis ........ 701/29
2006/0038572 A1 2/2006 Philbrook
2006/0043976 A1 3/2006 Gervais ........ 324/508
2006/0061469 A1 3/2006 Jaeger ........ 340/539.13
2006/0076923 A1 4/2006 Eaves ........ 320/112
2006/0079203 A1 4/2006 Nicolini ........ 455/411
2006/0089767 A1 4/2006 Sowa ........ 701/29
2006/0090554 A1 5/2006 Krampitz
2006/0090555 A1 5/2006 Krampitz
2006/0091597 A1 5/2006 Opsahl
2006/0092584 A1 5/2006 Raichle
2006/0095230 A1 5/2006 Grier et al. ........ 702/183
2006/0102397 A1 5/2006 Buck ........ 429/432
2006/0125482 A1 6/2006 Klang
2006/0136119 A1 6/2006 Raichle
2006/0139167 A1 6/2006 Davie
2006/0152224 A1 7/2006 Kim et al. ........ 324/430
2006/0155439 A1 7/2006 Slawinski ........ 701/33.4
2006/0161313 A1 7/2006 Rogers et al. ........ 701/1
2006/0161390 A1 7/2006 Namaky et al. ........ 702/183
2006/0217914 A1 9/2006 Bertness ........ 702/113
2006/0244456 A1 11/2006 Henningson
2006/0244457 A1 11/2006 Henningson et al. ........ 324/426
2006/0282227 A1 12/2006 Bertness
2006/0282323 A1 12/2006 Walker et al. ........ 705/14
2007/0005201 A1 1/2007 Chenn ........ 701/31.5
2007/0024460 A1 2/2007 Clark ........ 340/663
2007/0026916 A1 2/2007 Juds et al. ........ 463/1
2007/0046261 A1 3/2007 Porebski ........ 320/132
2007/0069734 A1 3/2007 Bertness
2007/0082652 A1 4/2007 Hartigan
2007/0088472 A1 4/2007 Ganzhorn et al. ........ 701/33
2007/0108942 A1 5/2007 Johnson et al. ........ 320/112
2007/0159177 A1 7/2007 Bertness et al. ........ 324/426
2007/0182576 A1 8/2007 Proska et al. ........ 340/636.1
2007/0194791 A1 8/2007 Huang ........ 324/430
2007/0194793 A1 8/2007 Bertness ........ 324/503
2007/0205752 A1 9/2007 Leigh ........ 324/500
2007/0205983 A1 9/2007 Naimo ........ 345/160
2007/0210801 A1 9/2007 Krampitz ........ 324/426
2007/0244660 A1 10/2007 Bertness
2007/0259256 A1 11/2007 Le Canut et al. ........ 429/90
2007/0279066 A1 12/2007 Chism ........ 324/437
2008/0023547 A1 1/2008 Raichle ........ 235/462.13
2008/0036421 A1 2/2008 Seo et al. ........ 320/132
2008/0053716 A1 3/2008 Scheucher ........ 180/2.1
2008/0059014 A1 3/2008 Nasr et al. ........ 701/22
2008/0064559 A1 3/2008 Cawthorne ........ 477/5
2008/0086246 A1 4/2008 Bolt et al. ........ 701/29
2008/0087479 A1 4/2008 Kang
2008/0094068 A1 4/2008 Scott ........ 324/426
2008/0103656 A1 5/2008 Lipscomb ........ 701/33.4
2008/0106267 A1 5/2008 Bertness ........ 320/112
2008/0169818 A1 7/2008 Lesesky et al. ........ 324/426
2008/0179122 A1 7/2008 Sugawara ........ 180/65.245
2008/0194984 A1 8/2008 Keefe ........ 600/559
2008/0238357 A1 10/2008 Bourilkov et al.
2008/0256815 A1 10/2008 Schafer
2008/0303528 A1 12/2008 Kim ........ 324/430
2008/0303529 A1 12/2008 Nakamura et al. ........ 324/433
2008/0315830 A1 12/2008 Bertness ........ 320/104
2009/0006476 A1 1/2009 Andreasen et al. ........ 707/104.1
2009/0011327 A1 1/2009 Okumura et al. ........ 429/99
2009/0013521 A1 1/2009 Okumura et al. ........ 29/730
2009/0024266 A1 1/2009 Bertness ........ 701/22
2009/0024419 A1 1/2009 McClellan ........ 705/4
2009/0085571 A1 4/2009 Bertness ........ 324/426
2009/0139781 A1 6/2009 Straubel
2009/0146610 A1 6/2009 Trigiani
2009/0146800 A1 6/2009 Grimlund et al. ........ 340/505
2009/0160395 A1 6/2009 Chen ........ 320/101
2009/0184165 A1 7/2009 Bertness et al.
2009/0198372 A1 8/2009 Hammerslag ........ 700/226
2009/0203247 A1 8/2009 Fifelski ........ 439/345
2009/0237029 A1 9/2009 Andelfinger ........ 320/108
2009/0237086 A1 9/2009 Andelfinger ........ 324/431
2009/0247020 A1 10/2009 Gathman et al. ........ 439/759
2009/0251151 A1 10/2009 Miyashita
2009/0259432 A1 10/2009 Liberty ........ 702/150
2009/0265121 A1 10/2009 Rocci ........ 702/57
2009/0273451 A1 11/2009 Soppera et al.
2009/0276115 A1 11/2009 Chen ........ 701/32
2009/0311919 A1 12/2009 Smith ........ 439/759
2010/0023198 A1 1/2010 Hamilton ........ 701/29
2010/0039065 A1 2/2010 Kinkade ........ 320/104
2010/0052193 A1 3/2010 Sylvester ........ 261/26
2010/0066283 A1 3/2010 Kitanaka ........ 318/400.02
2010/0088050 A1 4/2010 Keuss ........ 702/63
2010/0094496 A1 4/2010 Hershkovitz et al.
2010/0117603 A1 5/2010 Makhija ........ 320/162
2010/0145780 A1 6/2010 Nishikawa et al. ........ 705/14.11
2010/0161257 A1 6/2010 Cornett
2010/0214055 A1 8/2010 Fuji ........ 340/3.1
2010/0265131 A1 10/2010 Fabius
2010/0314950 A1 12/2010 Rutkowski et al. ........ 307/125
2011/0004427 A1 1/2011 Gorbold et al. ........ 702/63
2011/0015815 A1 1/2011 Bertness ........ 701/22
2011/0106280 A1 5/2011 Zeier ........ 700/90
2011/0127960 A1 6/2011 Plett
2011/0161025 A1 6/2011 Tomura ........ 702/63
2011/0215767 A1 9/2011 Johnson et al. ........ 320/136
2011/0218747 A1 9/2011 Bertness ........ 702/63
2011/0239445 A1 10/2011 Ibi
2011/0258112 A1 10/2011 Eder et al.
2011/0265025 A1 10/2011 Bertness
2011/0267067 A1 11/2011 Bertness et al.
2011/0273181 A1 11/2011 Park et al. ........ 324/429
2011/0294367 A1 12/2011 Moon ........ 439/878
2011/0300416 A1 12/2011 Bertness
2012/0041697 A1 2/2012 Stukenberg ........ 702/63
2012/0046807 A1 2/2012 Ruther ........ 701/2
2012/0046824 A1 2/2012 Ruther et al. ........ 701/31.5
2012/0062237 A1 3/2012 Robinson ........ 324/433
2012/0074904 A1 3/2012 Rutkowski et al. ........ 320/112

(56) References Cited

U.S. PATENT DOCUMENTS

2012/0086399 A1 4/2012 Choi
2012/0091962 A1 4/2012 DeFrank et al.
2012/0116391 A1 5/2012 Houser ........................... 606/41
2012/0182132 A1 7/2012 McShane
2012/0249069 A1 10/2012 Ohtomo ........................ 320/109
2012/0256494 A1 10/2012 Kesler ........................... 307/104
2012/0256568 A1 10/2012 Lee ............................... 318/139
2012/0274331 A1 11/2012 Liu ............................... 324/426
2012/0293372 A1 11/2012 Amendolare ................. 342/451
2012/0303397 A1 11/2012 Prosser
2013/0049678 A1 2/2013 Li
2013/0099747 A1 4/2013 Baba ............................. 310/118
2013/0106362 A1 5/2013 Mackintosh et al.
2013/0106596 A1 5/2013 Mouchet
2013/0115821 A1 5/2013 Golko ........................... 439/638
2013/0134926 A1 5/2013 Yoshida
2013/0158782 A1 6/2013 Bertness et al. ............. 701/34.4
2013/0172019 A1 7/2013 Youssef ...................... 455/456.6
2013/0200855 A1 8/2013 Christensen et al.
2013/0218781 A1 8/2013 Simon
2013/0288706 A1 10/2013 Yu ............................. 455/456.1
2013/0297247 A1 11/2013 Jardine
2013/0311124 A1 11/2013 Bremen ........................ 702/104
2013/0314041 A1 11/2013 Proebstle ..................... 320/109
2013/0325405 A1 12/2013 Miller
2014/0002021 A1 1/2014 Bertness
2014/0002094 A1 1/2014 Champlin ..................... 324/426
2014/0029308 A1 1/2014 Cojocaru ........................ 363/13
2014/0081527 A1 3/2014 Miller
2014/0091762 A1 4/2014 Kondo
2014/0099830 A1 4/2014 Byrne ........................... 439/638
2014/0117997 A1 5/2014 Bertness ....................... 324/426
2014/0132223 A1 5/2014 Kerfoot, Jr.
2014/0145670 A1 5/2014 van Zwam et al.
2014/0162497 A1 6/2014 Lim
2014/0194084 A1 7/2014 Noonan ..................... 455/404.1
2014/0225622 A1 8/2014 Kudo ............................ 324/433
2014/0239964 A1 8/2014 Gach ............................. 324/433
2014/0260577 A1 9/2014 Chinnadurai
2014/0266061 A1 9/2014 Wachal
2014/0278159 A1 9/2014 Chinnadurai
2014/0285209 A1 9/2014 Stichowski et al.
2014/0333313 A1 11/2014 Surampudi
2014/0354237 A1 12/2014 Cotton
2014/0368156 A1 12/2014 Aloe
2014/0374475 A1 12/2014 Kallfelz et al.
2015/0093922 A1 4/2015 Bosscher ........................ 439/39
2015/0115720 A1 4/2015 Hysell ............................. 307/65
2015/0166518 A1 6/2015 Boral et al.
2015/0168499 A1 6/2015 Palmisano
2015/0221135 A1 8/2015 Hill ............................... 345/633
2015/0239365 A1 8/2015 Hyde et al.
2015/0353192 A1 12/2015 Morrison
2016/0011271 A1 1/2016 Bertness
2016/0013523 A1 1/2016 Anzicek
2016/0091571 A1 3/2016 Salo, III
2016/0154044 A1 6/2016 Bertness
2016/0171799 A1 6/2016 Bertness
2016/0216335 A1 7/2016 Bertness
2016/0226280 A1 8/2016 Noor et al.
2016/0232736 A1 8/2016 Holtappels
2016/0238667 A1 8/2016 Palmisano et al.
2016/0253852 A1 9/2016 Bertness et al.
2016/0266212 A1 9/2016 Carlo
2016/0285284 A1 9/2016 Matlapudi et al.
2016/0321897 A1 11/2016 Lee
2016/0336623 A1 11/2016 Nayar
2016/0381542 A1 12/2016 Colby et al.
2017/0054317 A1 2/2017 Katsuki
2017/0093056 A1 3/2017 Salo, III et al.
2017/0146602 A1 5/2017 Samp
2017/0158058 A1 6/2017 Lee et al.
2017/0197514 A1 7/2017 Rivas et al.
2017/0253140 A1 9/2017 Chang
2017/0373410 A1 12/2017 Lipkin et al.
2018/0009328 A1 1/2018 Hinterberger et al.
2018/0113171 A1 4/2018 Bertness
2018/0301913 A1 10/2018 Irish et al.
2018/0306867 A1 10/2018 Bertness
2019/0033385 A1 1/2019 Karner
2019/0105998 A1 4/2019 Bertness
2019/0152332 A1 5/2019 Bertness
2019/0154763 A1 5/2019 Bertness
2019/0204392 A1 7/2019 Bertness
2020/0076129 A1 3/2020 Kitahara
2020/0086757 A1 3/2020 Vain et al.
2020/0161630 A1 5/2020 Zeng
2020/0174078 A1 6/2020 Salo, III et al.
2020/0274370 A1 8/2020 Krieg
2021/0048374 A1 2/2021 Sampson et al.
2021/0049480 A1 2/2021 Kale et al.
2021/0050631 A1 2/2021 Li
2021/0107152 A1 * 4/2021 Honkote ................ B25J 9/1661
2021/0135462 A1 5/2021 Sampson et al.
2021/0141021 A1 5/2021 Salo, III et al.
2021/0141043 A1 5/2021 Bertness
2021/0203016 A1 7/2021 Bertness
2021/0226187 A1 7/2021 Karr
2021/0231737 A1 7/2021 Salo, III et al.
2021/0237607 A1 8/2021 Chen et al.
2021/0325471 A1 10/2021 Bertness
2022/0050142 A1 2/2022 Bertness
2022/0258619 A1 8/2022 Bertness
2022/0384858 A1 12/2022 Bertness
2023/0063349 A1 3/2023 Bertness et al.
2023/0069766 A1 3/2023 Allag
2023/0087598 A1 3/2023 Lamer
2023/0155400 A1 5/2023 Wang
2023/0241990 A1 8/2023 Adams et al.
2023/0256829 A1 8/2023 Bertness
2023/0318321 A1 10/2023 Liu
2023/0333171 A1 10/2023 Bertness
2023/0339359 A1 10/2023 Numata
2023/0358818 A1 11/2023 Kolamkar et al.
2023/0387707 A1 11/2023 Bertness
2023/0391179 A1 12/2023 Sampson et al.
2024/0332651 A1 10/2024 Queren
2024/0416770 A1 12/2024 Roland et al.
2024/0429653 A1 12/2024 Dos Santos
2025/0130264 A1 4/2025 Bertness
2025/0141966 A1 5/2025 Petiwala
2025/0348092 A1 * 11/2025 Andrae ................... H04W 4/46

FOREIGN PATENT DOCUMENTS

CN 103091633 5/2013
CN 206658084 11/2017
CN 109683054 1/2019
CN 114156586 3/2022
CN 114520393 5/2022
DE 29 26 716 B1 1/1981
DE 40 07 883 9/1991
DE 196 38 324 9/1996
DE 601 12 502 T2 6/2006
DE 10 2009 013 857 10/2009
DE 10 2008 036 595 A1 2/2010
DE 10 2018 001885 9/2018
DE 10 2020 216599 7/2021
EP 0 022 450 A1 1/1981
EP 0 391 694 A2 4/1990
EP 0 476 405 A1 9/1991
EP 0 637 754 A1 2/1995
EP 0 772 056 A1 5/1997
EP 0 982 159 A2 3/2000
EP 1 810 869 A1 11/2004
EP 1 786 057 5/2007
EP 1 807 710 B1 7/2007
EP 1 807 710 1/2010
EP 2 302 724 3/2011
FR 2 749 397 12/1997
GB 154 016 11/1920
GB 2 029 586 3/1980
GB 2 088 159 A 6/1982
GB 2 246 916 A 10/1990

(56) References Cited

FOREIGN PATENT DOCUMENTS

| | | | |
|---|---|---|---|
| GB | 2 266 150 | | 10/1993 |
| GB | 2 275 783 | A | 7/1994 |
| GB | 2 353 367 | | 2/2001 |
| GB | 2 387 235 | A | 10/2003 |
| JP | 59-17892 | | 1/1984 |
| JP | 59-17893 | | 1/1984 |
| JP | 59017894 | | 1/1984 |
| JP | 59215674 | | 12/1984 |
| JP | 60225078 | | 11/1985 |
| JP | 62-180284 | | 8/1987 |
| JP | 63027776 | | 2/1988 |
| JP | 03274479 | | 12/1991 |
| JP | 03282276 | | 12/1991 |
| JP | 4-8636 | | 1/1992 |
| JP | 04095788 | | 3/1992 |
| JP | 04131779 | | 5/1992 |
| JP | 04372536 | | 12/1992 |
| JP | 05211724 | A | 8/1993 |
| JP | 5216550 | | 8/1993 |
| JP | 7-128414 | | 5/1995 |
| JP | 09061505 | | 3/1997 |
| JP | 10056744 | | 2/1998 |
| JP | 10232273 | | 9/1998 |
| JP | 11103503 | A | 4/1999 |
| JP | 11-150809 | | 6/1999 |
| JP | 11-271409 | | 10/1999 |
| JP | 2001-023037 | | 1/2001 |
| JP | 2001057711 | A | 2/2001 |
| JP | 2003-346909 | | 12/2003 |
| JP | 2005-238969 | | 9/2005 |
| JP | 2006/242674 | | 9/2006 |
| JP | 2006331976 | A | 12/2006 |
| JP | 2009-244166 | | 10/2009 |
| JP | 2009-261174 | | 11/2009 |
| JP | 2010-172122 | | 5/2010 |
| JP | 2010-172142 | | 8/2010 |
| JP | 2011-216328 | | 10/2011 |
| JP | 2013-110069 | | 6/2013 |
| JP | 2022-509101 | | 1/2022 |
| RU | 2089015 | C1 | 8/1997 |
| WO | WO 93/22666 | | 11/1993 |
| WO | WO 94/05069 | | 3/1994 |
| WO | WO 96/01456 | | 1/1996 |
| WO | WO 96/06747 | | 3/1996 |
| WO | WO 96/28846 | | 9/1996 |
| WO | WO 97/01103 | | 1/1997 |
| WO | WO 97/44652 | | 11/1997 |
| WO | WO 98/04910 | | 2/1998 |
| WO | WO 98/21132 | | 5/1998 |
| WO | WO 98/58270 | | 12/1998 |
| WO | WO 99/23738 | | 5/1999 |
| WO | WO 99/56121 | | 11/1999 |
| WO | WO 00/16083 | | 3/2000 |
| WO | WO 00/62049 | | 10/2000 |
| WO | WO 00/67359 | | 11/2000 |
| WO | WO 01/59443 | | 2/2001 |
| WO | WO 01/16614 | | 3/2001 |
| WO | WO 01/16615 | | 3/2001 |
| WO | WO 01/51947 | | 7/2001 |
| WO | WO 03/047064 | A3 | 6/2003 |
| WO | WO 03/076960 | A1 | 9/2003 |
| WO | WO 2004/047215 | A1 | 6/2004 |
| WO | WO 2007/059935 | | 5/2007 |
| WO | WO 2007/075403 | | 7/2007 |
| WO | WO 2009/004001 | | 1/2009 |
| WO | WO 2010/007681 | | 1/2010 |
| WO | WO 2010/035605 | | 4/2010 |
| WO | WO 2010/042517 | | 4/2010 |
| WO | WO 2011/153419 | | 12/2011 |
| WO | WO 2012/078921 | | 6/2012 |
| WO | WO 2013/070850 | | 5/2013 |
| WO | 2016176405 | | 11/2016 |
| WO | 2022/241800 | | 11/2022 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDS*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-$4^{th}$-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, prior to Oct. 1, 2002.

"#12: LM78S40 Simple Switcher DC to DC Converter", *ITM e-Catalog*, downloaded from http://www.pcbcafe.com, prior to Oct. 1, 2002.

"Simple DC-DC Converts Allows Use of Single Battery", *Electronix Express*, downloaded from http://www.elexp.com/t_dc-dc.htm, prior to Oct. 1, 2002.

"DC-DC Converter Basics", *Power Designers*, downloaded from http://www.powerdesigners.com/InforWeb. design_center/articles/DC-DC/converter.shtm, prior to Oct. 1, 2002.

"Notification of Transmittal of The International Search Report or the Declaration", PCT/US02/29461, filed Sep. 17, 2002 and mailed Jan. 3, 2003.

"Notification of Transmittal of The International Search Report or the Declaration", PCT/US03/07546, filed Mar. 13, 2003 and mailed Jul. 4, 2001.

"Notification of Transmittal of The International Search Report or the Declaration", PCT/US03/06577, filed Mar. 5, 2003 and mailed Jul. 24, 2003.

"Notification of Transmittal of The International Search Report or the Declaration", PCT/US03/07837, filed Mar. 14, 2003 and mailed Jul. 4, 2003.

"Improved Impedance Spectroscopy Technique For Status Determination of Production Li/$SO_2$ Batteries" Terrill Atwater et al., pp. 10-113, (1992).

"Notification of Transmittal of The International Search Report or the Declaration", PCT/US03/41561; Search Report completed Apr. 13, 2004, mailed May 6, 2004.

"Notification of Transmittal of The International Search Report or the Declaration", PCT/US03/27696, filed Sep. 4, 2003 and mailed Apr. 15, 2004.

(56) References Cited

OTHER PUBLICATIONS

"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2; Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and mailed Nov. 24, 2004.
"A review of impedance measurements for determination of the state-of-charge or state-of- health of secondary batteries", Journal of Power Sources, pp. 59-69, (1998).
"Search Report Under Section 17" for Great Britain Application No. GB0421447. 4, date of search Jan. 27, 2005, date of document Jan. 28, 2005.
"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.
"Examination Report" from the UK Patent Office for App. No. 0417678.0; Jan. 24, 2005.
Wikipedia Online Encyclopedia, INDUCTANCE, 2005, http://en.wikipedia.org/wiki/inductance, pp. 1-5, mutual Inductance, pp. 3, 4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, San Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International Searching Authority, or the Declaration for PCT/US2011/038279 filed May 27, 2011, date of mailing Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.) .
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M. W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used In Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et al., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV PLUS Battery Packs", by A. Paryani, *IEEE AES Systems Magazine*, Nov. 2000, pp. 21-24.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111020643 dated Aug. 28, 2014.
Office Action from Japanese Patent Application No. 2013-513370, dated Aug. 5, 2014.

(56) References Cited

OTHER PUBLICATIONS

Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.
Notification of Transmittal of the Search Report and the Written Opinion from PCT/US2016/014867, dated Jun. 3, 2016.
Office Action from Japanese Patent Application No. 2015-014002, dated Jul. 19, 2016.
Notification of Transmittal of the International Search Report and the Written Opinion of the International Searching Authority from PCT/US2016/029696, dated Aug. 24, 2016.
Office Action from German Patent Application No. 10393251.8, dated Nov. 4, 2016, including English translation.
Office Action from European Patent Application No. 15 151 426.2-1801, dated Aug. 28, 2017, 2 pages.
Office Action from German Patent Application No. 112011101892.4, dated Sep. 7, 2017.
Office Action from Japanese Patent Application No. 2017-026740, dated Jan. 9, 2018.
Office Action from Chinese Patent Application No. 201480066251.8, dated May 29, 2018.
Brochure: "Sensors Intelligent Battery Sensors, Measuring Battery Capacity and Ageing", by Hella, 6 pgs.
Office Action from Japanese Patent Application No. 2017-026740, dated May 8, 2018.
U.S. Appl. No. 12/697,485, filed Feb. 1, 2010, 36 pgs.
Office Action from Chinese Patent Application No. 201480066251.8, dated Dec. 13, 2018.
Notification of Transmittal of the International Search Report and the Written Opinion of the International Searching Authority, or the Declaration for PCT/US2019/014487, dated Apr. 11, 2019.
Notification of Transmittal of the International Search Report and the Written Opinion of the International Searching Authority, or the Declaration for PCT/US2019/014494, dated Apr. 24, 2019.
Office Action from German Patent Application No. 11 2011 101 892.4, dated Oct. 1, 2020, and translation using Google Translate.
Wikipedia Online Encyclopedia, https: // de.wikipedia.org/w/index.php?title= four-wire measurement & oldid=67143514-4 (Retrieved Sep. 15, 2020) along with Google Translation.
Notification of Transmittal of the International Search Report and the Written Opinion of the International Searching Authority, or the Declaration for PCT/US2020/059015, dated Jan. 22, 2021.
U.S. Appl. No. 17/504,897, filed Oct. 19, 2021.
Notification of Transmittal of the International Search Report and the Written Opinion of the International Searching Authority, or the Declaration for PCT/US2021/040313 dated Oct. 25, 2021; 14 pages.
U.S. Appl. No. 17/893,412, filed Aug. 23, 2022.
U.S. Appl. No. 18/616,458, filed Mar. 26, 2024.
U.S. Appl. No. 18/609,344, filed Mar. 19, 2024.
U.S. Appl. No. 18/740,030, filed Jun. 11, 2024.
International Search Report for the Corresponding International Patent Application No. PCT/US2024/033558, dated Sep. 3, 2024, dated Jun. 12, 2024, 5 pages.
Written Opinion for the Corresponding International Patent Application No. PCT/US2024/033558, dated Sep. 3, 2024, dated Jun. 12, 2024, 8 pages.
International Search Report and Written Opinion for corresponding International Application No. PCT/US2024/053504, dated Jan. 21, 2025, 15 pages.
George Coulouris et al. "Distributed Systems: Concepts and Design (5th edition)", Addison-Wesley, May 7, 2011.
Gehrmann Christian et al.: "Bluetooth Security" Artech House Publishers, Jul. 5, 2004.
Owen C. Duffy et al. "Fundamentals of Medium/Heavy Duty Commercial Vehicle Systems," Jones & Bartlett Learning, Jul. 27, 2015.
Wikipedia: "List of Bluetooth profiles," Internet Article, Oct. 6, 2023.
Nick Hunn et al. "Essentials of Short-Range Wireless," Cambridge University Press, Aug. 23, 2010.
International Search Report and Written Opinion for corresponding International Application No. PCT/US2024/051765, dated Jan. 16, 2025, 15 pages.
International Search Report and Written Opinion for corresponding International Application No. PCT/US2025/034321, dated Oct. 17, 2025, 14 pages.

* cited by examiner

VEHICLE MAINTENANCE SYSTEM WITH DYNAMIC NETWORK

CROSS-REFERENCE TO RELATED APPLICATION

The present application is based on and claims the benefit of U.S. provisional patent application Ser. No. 63/594,195, filed Oct. 30, 2023, the contents of which are hereby incorporated by reference in their entirety.

BACKGROUND

Various types of vehicle maintenance devices are known in the art and have widespread uses. One use of such maintenance devices is for vehicle inspections. For example, a vehicle emission inspection can be performed to ensure the vehicle meets any emission requirements in a particular region. A vehicle safety inspection is another example and may be employed on vehicles using an internal combustion engine as well as electric vehicles.

The vehicle inspections are typically performed using one or more independent maintenance devices. An operator tests the vehicle using the various maintenance devices and records the result in order to determine if the vehicle has passed the inspection requirements.

Various techniques have been pioneered by Dr. Keith S. Champlin and Midtronics, Inc. of Willowbrook, Ill. for performing maintenance on vehicles and batteries. These techniques are described in a number of United States patents, for example, U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Patent No. 5,572, 136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S.

Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,696,819, issued Feb. 24, 20144; U.S. Pat. No. 6,707,303, issued Mar. 16, 2004; U.S. Pat. No. 6,737, 831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208, 914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Patent No. 7,398, 176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Pat. No. 8,674,654, issued Mar. 18, 2014; U.S. Pat. No. 8,674,711, issued Mar. 18, 2014; U.S. Pat. No. 8,704,483, issued Apr. 22, 2014; U.S. Pat. No. 8,738,309, issued May 27, 2014; U.S. Pat. No. 8,754,653, issued Jun. 17, 2014; U.S. Pat. No. 8,872,516, issued Oct. 28, 2014; U.S. Pat. No. 8,872,517, issued Oct. 28, 2014; U.S. Pat. No. 8,958,998, issued Feb. 17, 2015; U.S. Pat. No. 8,963,550, issued Feb. 24, 2015; U.S. Pat. No. 9,018,958, issued Apr. 28, 2015; U.S. Pat. No. 9,052,366, issued Jun. 9, 2015; U.S. Pat. No. 9,201,120, issued Dec. 1, 2015; U.S. Pat. No. 9,229,062, issued Jan. 5, 20126; U.S. Pat. No. 9,244,100, issued Jan. 26, 2016; U.S. Pat. No. 9,255,955, issued Feb. 9, 2016; U.S. Pat. No. 9,274,157, issued Mar. 1, 2016; U.S. Pat. No. 9,312,575, issued Apr. 12, 2016; U.S. Pat. No. 9,335,362, issued May 10, 2016; U.S. Pat. No. 9,425,487, issued Aug. 23, 2016; U.S. Pat. No. 9,419,311, issued Aug. 16, 2016; U.S. Pat. No. 9,496,720, issued Nov. 15, 2016; U.S. Pat. No. 9,588,185, issued Mar. 7, 2017; U.S. Pat. No. 9,923,289, issued Mar. 20, 2018; U.S. Pat. No. 9,966,676, issued May 8, 2018; U.S. Pat. No. 10,046,649, issued Aug. 14, 2018; U.S. Pat. No. 10,222,397, issued Mar. 5, 2019; U.S. Pat. No. 10,317,468, issued Jun. 11, 2019; U.S. Pat. No. 10,429,449, issued Oct. 1, 2019; U.S. Pat. No. 10,473,555, issued Nov. 12, 2019; U.S. Pat. No. 10,608,353, issued Mar. 31, 2020; U.S. Pat. No. 10,843,574, issued Nov. 24, 2020; U.S. Pat. No. 11,054, 480, issued Jul. 6, 2021; U.S. Pat. No. 11,325,479, issued May 10, 2022; U.S. Pat. No. 11,474,153, issued Oct. 18, 2022; U.S. Pat. No. 11,486,930, issued Nov. 1, 2022; U.S. Pat. No. 11,513,160, issued Nov. 29, 2022; U.S. Pat. No. 11,545,839, issued Jan. 3, 2023; U.S. Pat. No. 11,548,404, issued Jan. 10, 2023; U.S. Pat. No. 11,566,972, issued Jan. 31, 2023; U.S. Pat. No. 11,650,259, issued May 16, 2023; U.S. Pat. No. 11,668,779, issued Jun. 6, 2023; U.S. Pat. No. 11,740,294, issued Aug. 29, 2023; U.S. Pat. No. 11,926,224, issued Mar. 12, 2024; U.S. Pat. No. 11,973,202, issued Apr. 30, 2024; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880, 473, filed Jun. 13, 2001; entitled BATTERY TEST MODULE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/263,473, filed Oct. 2, 2002, entitled ELECTRONIC BATTERY TESTER WITH RELATIVE TEST OUTPUT; U.S. Ser. No. 09/653,963, filed Sep. 1, 2000, entitled SYSTEM AND METHOD FOR CONTROLLING POWER GENERATION AND STORAGE; U.S. Ser. No. 10/174, 110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 11/356,443, filed Feb. 16, 2006, entitled ELECTRONIC BATTERY TESTER WITH NETWORK COMMUNICATION; U.S. Ser. No. 12/697,485, filed Feb. 1, 2010, entitled ELECTRONIC BATTERY TESTER; U.S. Ser. No. 12/769, 911, filed Apr. 29, 2010, entitled STATIONARY BATTERY TESTER; U.S. Ser. No. 13/152,711, filed Jun. 3, 2011, entitled BATTERY PACK MAINTENANCE FOR ELECTRIC VEHICLE; U.S. Ser. No. 14/039,746, filed Sep. 27, 2013, entitled BATTERY PACK MAINTENANCE FOR ELECTRIC VEHICLE; U.S. Ser. No. 14/565,589, filed Dec. 10, 2014, entitled BATTERY TESTER AND BATTERY REGISTRATION TOOL; U.S. Ser. No. 15/017,887, filed Feb. 8, 2016, entitled METHOD AND APPARATUS FOR MEASURING A PARAMETER OF A VEHICLE ELECTRICAL SYSTEM; U.S. Ser. No. 15/049,483, filed Feb. 22, 2016, entitled BATTERY TESTER FOR ELECTRIC VEHICLE; U.S. Ser. No. 15/077,975, filed Mar. 23, 2016, entitled BATTERY MAINTENANCE SYSTEM; U.S. Ser. No. 15/149,579, filed May 9, 2016, entitled BATTERY TESTER FOR ELECTRIC VEHICLE; U.S. Ser. No. 16/253,526, filed Jan. 22, 2019, entitled HIGH CAPACITY BATTERY BALANCER; U.S. Ser. No. 17/364,953, filed Jul. 1, 2021, entitled ELECTRICAL LOAD FOR ELECTRONIC BATTERY TESTER AND ELECTRONIC BATTERY TESTER INCLUDING SUCH ELECTRICAL LOAD; U.S. Ser. No. 17/504,897, filed Oct. 19, 2021, entitled HIGH CAPACITY BATTERY BALANCER; U.S. Ser. No. 17/750,719, filed May 23, 2022, entitled BATTERY MONITORING SYSTEM; U.S. Ser. No. 17/893,412, filed Aug. 23, 2022, entitled POWER ADAPTER FOR AUTOMOTIVE VEHICLE MAINTENANCE DEVICE; U.S. Ser. No. 18/166,702, filed Feb. 9, 2023, entitled BATTERY MAINTENANCE DEVICE WITH HIGH VOLTAGE CONNECTOR; U.S. Ser. No. 18/314,266, filed May 9, 2023, entitled ELECTRONIC BATTERY TESTER, U.S. Ser. No. 18/324,382, filed May 26, 2023, entitled STACKABLE BATTERY MAINTENANCE SYSTEM, U.S. Ser. No. 18/328,827, filed Jun. 5, 2023, entitled ELECTRIC VEHICLE BATTERY STORAGE VESSEL; U.S. Ser. No. 18/337,203, filed Jun. 19, 2023, entitled HIGH USE BATTERY PACK MAINTENANCE; U.S. Ser. No. 18/609,344, filed Mar. 19, 2024, entitled INTELLIGENT MODULE INTERFACE FOR BATTERY MAINTENANCE DEVICE; U.S. Ser. No. 18/616,458, filed Mar. 26, 2024, entitled EV BATTERY CHARGING SOLUTION FOR CONTAINERS; U.S. Ser. No. 18/740,030, filed Jun. 11, 2024; all of which are incorporated herein by reference in their entireties.

SUMMARY

A plurality of automotive tools is provided and each of which includes communication circuitry which provides communication between at least another tool in the plurality of tools. Cluster forming circuitry is configured to form a cluster comprising at least two tools in the plurality of tools. Each of the plurality of tools has at least one capability. Data sharing circuitry is configured to share data between the at least two tools in the cluster such that use of the at least one capability is shared between the at least two tools in the cluster.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION

Figure 1:
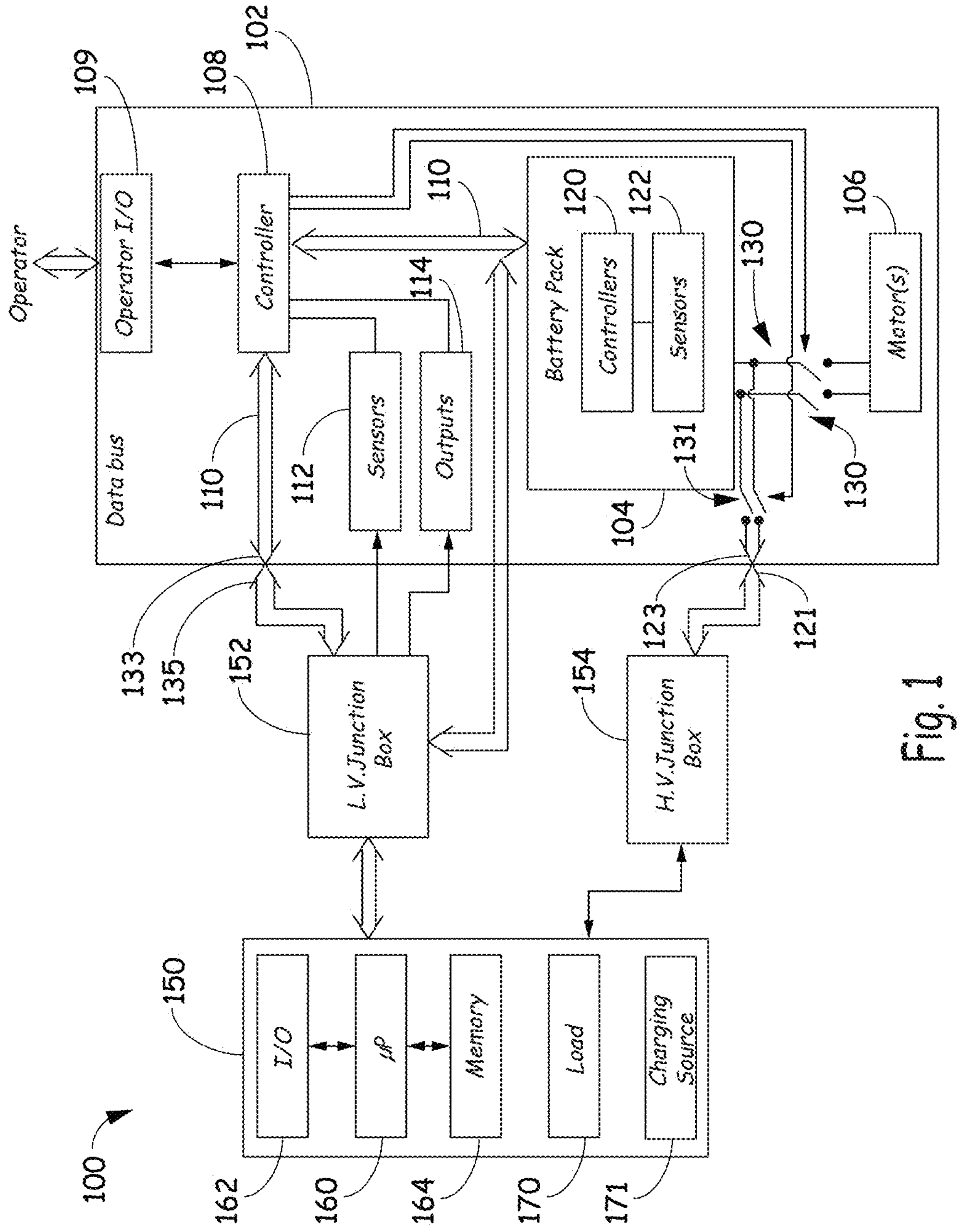
FIG. 1 is a simplified block diagram of an example configuration of a tool or measurement device for performing a mesh cluster and testing various aspects of an automotive vehicle.

Embodiments of the present disclosure are described more fully hereinafter with reference to the accompanying drawings. Elements that are identified using the same or similar reference characters refer to the same or similar elements. Some elements may not be shown in each of the figures in order to simplify the illustrations.

The various embodiments of the present disclosure may be embodied in many different forms and should not be construed as limited to the specific embodiments set forth herein. Rather, these embodiments are provided so that this disclosure will be thorough and complete, and will fully convey the scope of the present disclosure to those skilled in the art.

Various types of vehicle maintenance equipment, including battery maintenance equipment, are used in commercial and government settings in which more than one such maintenance device is present. For example, a vehicle maintenance center may have multiple types of maintenance devices. Such devices include, for example, devices used to charge batteries, test batteries, read back diagnostic codes from a vehicle, check tire inflation, check aspects of the electric drive train, check other control systems within the vehicle, check operation of the motor and drive train of the vehicle, monitor safety related aspects of the vehicle including electrical short circuits, faulty grounds, failing connections or insulation, receive or send user input or output, provide wired or wireless communication, provide a printed output, store data, provide data analysis, etc. Similarly, in some jurisdictions, the local state or federal regulators require vehicle safety inspections in which multiple maintenance devices are present for use in determining the safety of operating a vehicle. This safety inspection can be used to verify that the vehicle is safe for operation in order for the vehicle to be certified for commercial sale or operation on public roads.

In such maintenance facilities, typically one or more operators or technicians perform various tests or other maintenance on a vehicle. The results of the test or maintenance operations can be recorded for use in determining a condition of a vehicle and either used locally or transmitted to another location. However, in such a configuration, efficient use is not made of the capabilities of all of the various maintenance devices that are present. For example, some devices may have duplicate functionality which is not necessary. Similarly, other devices may have limited functionality, requiring additional steps to be performed by an operator. These deficiencies and redundancies increase the cost of the overall maintenance facility and increase the amount of time required to perform maintenance on a vehicle. The present invention provides an implementation which addresses the shortcomings of the prior art configurations of such maintenance facilities to thereby increase efficiency of the vehicle maintenance process as well decrease the time required to perform such maintenance and decrease the cost to implement the maintenance facility.

With the present invention, a mesh network (or “cluster”) is created which comprises a plurality of distinct vehicle maintenance devices. Each maintenance device communicates information related to its capabilities, and the mesh system logic determines priorities of individual maintenance devices based upon each device’s capabilities. The capabilities of the various devices include both the test that a particular device is able to perform as well as other capabilities including communication capabilities such as local communication or distant communication through the internet or other communication techniques, user I/O capabilities including input techniques and methods along with display and other output techniques, the capability of outputting a physical report using a printer, other types of input including an optical scanned or the capability of connecting to the databus of the vehicle, etc. Further, another example of a capability of a vehicle maintenance device is the amount of computing power and/or the amount of a storage a device has, including both permanent and volatile storage. Based upon these capabilities, a hierarchy of the various maintenance devices is determined, and a mesh type configuration between the devices in implemented, typically using a wireless communication technique between the various maintenance devices. However, in some configurations, one or more such maintenance devices communicate over a physical wired connection. If a mesh is formed that includes a physical connection, various physical aspects of such devices can be shared, for example, one device can provide power to a second device.

FIG. 1 is a simplified block diagram showing maintenance/diagnostic device 100 coupled to an electric vehicle 102. Device 100 is illustrated in a general way as a type of device used in the mesh configuration at a maintenance facility in accordance with one example configuration of the invention. The vehicle 102 is illustrated in a simple block diagram and includes a battery pack 104 used to power the vehicle 102 including providing power to motor(s) 106 of the vehicle. The vehicle 102 includes a vehicle controller 108 coupled to a databus 110 of the vehicle. The controller 108 receives information regarding operation of the vehicle through sensors 112 and controls operation of the vehicle through outputs 114. Further, the battery pack 104 is illustrated as including its own optional controller 120 which monitors operation of the battery pack 104 using battery pack sensors 122.

During operation, the electric vehicle 102 is controlled by the controller 108, for example, based upon input from a driver through operator I/O 109. Operator I/O 109 can comprise, for example, a foot accelerator input, a brake input, an input indicating a position of a steering wheel, information related to a desired gearing ratio for a drive train, outputs related to operation of the vehicle such as speed, charging information, amount of energy which remains in the battery pack 104, diagnostic information, etc. The controller 108 can control operation of the electric motors 106 to propel the vehicle, as well as monitor and control other systems of the vehicle 102. The controller 120 of battery pack 104 can be used to monitor the operation of the battery pack 104. For example, the sensors 122 may include temperature sensors configured to disconnect the batteries of the battery pack if a threshold temperature is exceeded. Other example sensors include current or voltage sensors, which can be used to monitor charge of the battery pack 104. FIG. 1 also illustrates contactor relays 130 of the vehicle 102 which are used to selectively decouple the battery pack 104 from systems of the vehicle 102 as discussed above. For example, the controller 108 can provide a signal to cause the contactors 130 to close, thereby connecting the battery pack 104 to electrical systems of the vehicle 102.

Device 100 includes a main unit 150 which couples to the vehicle through a low voltage junction box 152 and a high voltage junction box 154. These junction boxes 152, 154 are optional and other techniques may be used for coupling the maintenance device 100 to the vehicle 102. Maintenance device 100 includes a microprocessor 160, I/O circuitry 162 and memory 164 which contains, for example, programming instructions for use by microprocessor 160. The I/O circuitry 162 can be used to both user input, output, remote input, output as well as input and output with vehicle 102. The maintenance device 100 includes a controllable load 170 for use in discharging the battery pack 104. An optional charging source 171 is also provided and can be used in situations in which it is desirable to charge the battery pack 104, for example, to perform maintenance on the battery pack 104. The high voltage junction box 154 is used to provide an electrical connection between terminals of the battery pack 104 and the maintenance device main unit 150. Using this connection, batteries within the battery pack 104 can be discharged using the load 170 or charged using the charging source 171. Similarly, low voltage junction box 152 is used by battery pack maintenance device 100 to couple to low voltage systems of the electric vehicle 102. Such systems include the databus 110 of the vehicle, sensors 112, outputs 114, etc. Through this connection, as discussed above, the maintenance device 100 can gather information regarding the condition of systems within the vehicle 102 including the battery pack 104, and can control operation of systems within the vehicle 102. Similarly, through this connection, the outputs from sensors 112 can be changed or altered whereby altered sensor outputs can be provided to controller 108. This can be used, for example, to cause controller 108 to receive information indicating that the vehicle 102 or battery pack 104 is in a condition which is different than from what the sensors 112 are actually sensing. For example, this connection can be used to cause the contactors 130 to close to thereby provide an electrical connection to the battery pack 104. Further, the low voltage junction box 152 can be used to couple to the controller 120 and/or sensors 122 of the battery pack 104. The junction boxes 152, 154 couple to vehicle 102 through the use of an appropriate connector. The particular connector which is used can be selected based upon the specific type of vehicle 102 and the type of connections which are available to an operator. For example, OBD II connection can be used to couple to the databus 110 of the vehicle. Other plugs or adapters may be used to couple to sensors 112 or outputs 114. A particular style plug may be available for coupling the high voltage junction box 154 to the battery pack 104. If there are no contactors which are available or if they cannot be accessed or are unresponsive, in one configuration clips or other types of clamp on or selectively connectable contactors can be used to perform the coupling.

Vehicle 102 includes a data port 133, such as an OBD II port. This allows device 100 co communication with a databus of the vehicle. In such a configuration, a data connector 135 is provided for connecting to data port 133.

In one configuration, the high voltage connection to the vehicle is made through the vehicle charging port 123 and the device 00 includes a charging plug 121 of the appropriate configuration. The vehicle 102 includes additional contactors 131 which are used to selectively couple the battery pack 104 to the charging port 123. Some charging ports also include a data connection. In such a configuration, data port 133 can be included with charging port 123. Further, some configurations allow the transmission of data over the same wires used to provide the charging connection.

Figure 2:
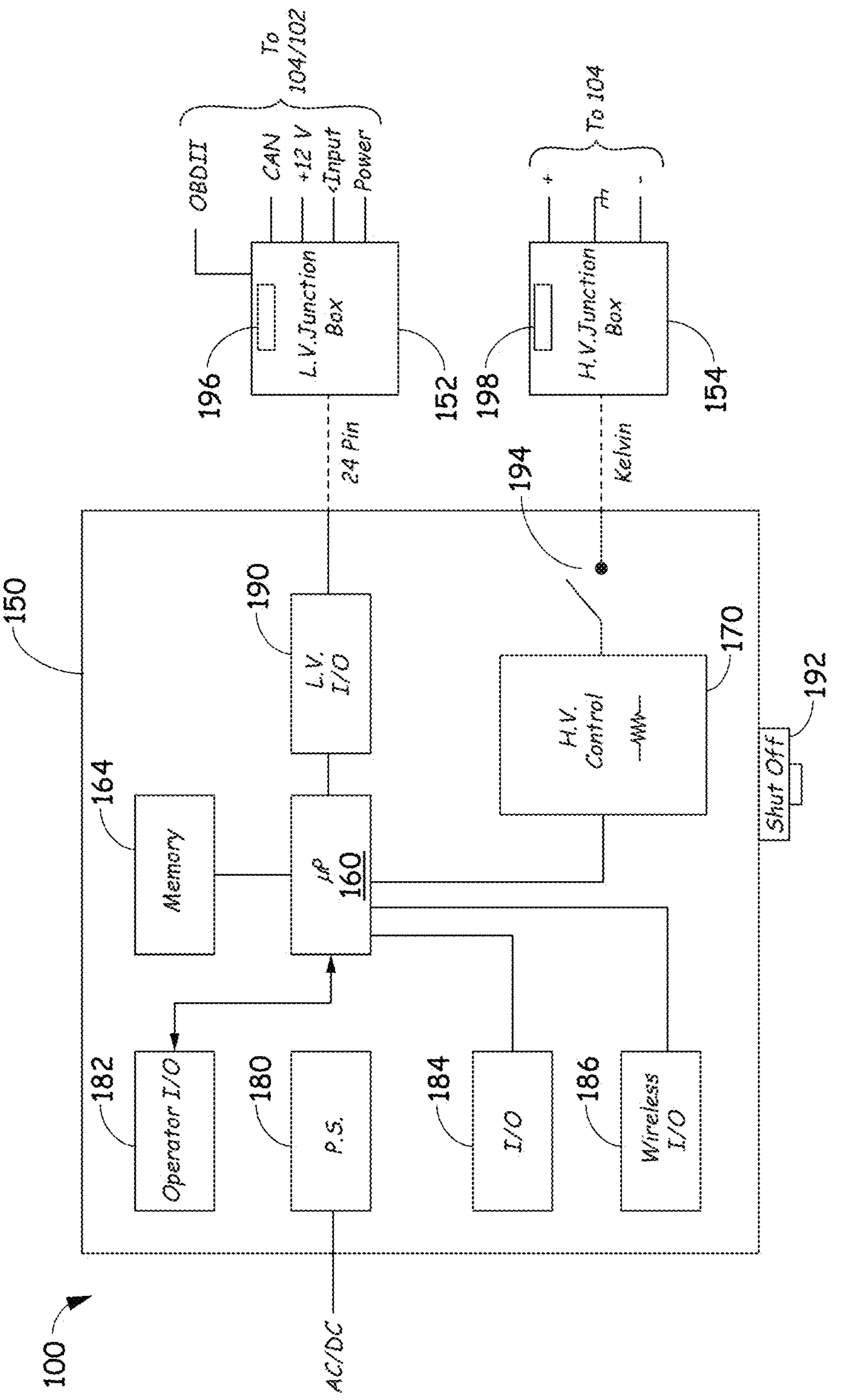
FIG. 2 is a simplified diagram showing additional details of the device of FIG. 1.

FIG. 2 is a simplified block diagram of a battery pack maintenance device 100 in accordance with one example embodiment of the present invention. The device includes a microprocessor 160 which operates in accordance with instructions stored in a memory 164 and can be used to implement the mesh system logic. A power supply is used to provide power to the device. The power supply 180 can be coupled to an AC power source, such as a wall outlet or other high power source, for use in charging the battery pack 104 of the vehicle 102. Additionally, the power supply 180 can be coupled to a DC power source, such as a 12 Volt battery, if the device 100 is only used for discharging of the vehicle battery pack 104. For example, in addition to the battery pack 104, many electric vehicles also include a standard 12 Volt automotive battery. This 12 Volt automotive battery can be used to power maintenance device 100. The microprocessor communicates with an operator using an operator input/output 182. Other input/output circuitry 184 is provided for use in physically connecting to a data communication link such as an RS232, USB connection, Ethernet, etc. An optional wireless I/O circuit 186 is also provided for use in communicating in accordance with wireless technologies such as Wi-Fi techniques, Bluetooth®, Zigbee®, etc. Low voltage input/output circuitry 190 is provided for use in communicating with the databus of the vehicle 108, the databus of the battery pack 104, or receiving other inputs or providing outputs to the vehicle 102. Examples include the CAN communication protocol, OBDII, etc. Additionally, contact closures or other voltage inputs or outputs can be applied to the vehicle using the low voltage I/O circuitry 190. FIG. 2 also illustrates an operator shut off switch 192 which can be activated to immediately disconnect the high voltage control 170 from the battery 104 using disconnect switch 194. Other circuit configurations can be used to implement this shut off capability. This configuration allows an operator to perform an emergency shut off or otherwise immediately disconnect the device 100 from the battery if desired.

The low voltage junction box 152 also provides an optional power output. This power can be used, for example, to power components of the vehicle 102 if the vehicle 102 has lost power. This can be useful, for example, to provide power to the controller 108 of the vehicle 102 such that information may be gathered from the vehicle and various components of the vehicle can be controlled such as the contactors 130.

In one configuration, the connection between the high voltage control circuitry 170 and the high voltage junction box 154 is through Kelvin type connectors. This can be used to eliminate the voltage drop which occurs when large currents are drawn through wiring to thereby provide more accurate voltage measurements. The actual connection between the junction box 154 and the battery pack 104 need not be through a Kelvin connection if the distance between the junction box 154 and the battery pack 104 is sufficiently short for the voltage drop across the connection leads to be negligible. Isolation circuitry such as fuses may be provided in the junction box 154 to prevent the application of a high voltage or current to the maintenance device 100 and thereby protect circuitry in the device. Similarly, the low voltage junction box 152 and/or the low voltage I/O 190 may include isolation circuitry such as optical isolators, inductors to provide inductive coupling, or other techniques. The low voltage junction box 152 may also include an optional user output and/or input 196. For example, this may be a display which can be observed by an operator. An example display includes an LED display, or individual LEDs, which provides an indication to the operator regarding the functioning of the low voltage junction box, the vehicle, or the battery pack. This can be used to visually inform an operator regarding the various functions being performed by the low voltage junction box, voltages detected by the low voltage junction box. A visual output and/or input 198 can be provided on the high voltage junction box 154.

The appropriate high voltage junction box 154 and low voltage junction box 152 can be selected based upon the particular vehicle 102 or battery pack 104 being inspected. Similarly, the junction boxes 152, 154 can be selected based upon the types of connections which are available in a particular situation. For example, if the vehicle his damaged, it may be impossible to couple to the battery pack 104 through available connectors. Instead, a junction box 154 can be employed which includes connection probes which can be coupled directly to the battery pack 104. Further still, if such a connection is not available or is damaged, connectors can be provided for coupling to individual cells or batteries within the battery pack 104.

The use of the low voltage and high voltage junction boxes 152, 154 are advantageous for a number of reasons. The junction boxes can be used to provide a standardized connection to the circuitry of the maintenance device 100. From a junction box 152, 154, specialized connectors can be provided for use with different types of vehicles and/or battery packs. Similarly, different types of junction boxes 152, 154 can be utilized for different vehicles and/or battery packs. The junction boxes 152, 154 allow a single set of cable connection to extend between the device 100 and a remote location. This provides better cable management, ease of use, and increased accuracy.

In addition to use as a load for discharging the battery, the high voltage control circuitry may also optionally include a charging for use in charging the battery.

When the device 100 is coupled to a vehicle 102 which has been in an accident, the device can perform various tests on the vehicle 102 to determine the condition of the vehicle and the battery. For example, in one aspect, the device 100 detects a leakage between the positive and negative terminals of the battery pack 102 and the ground or chassis of the vehicle 102.

During discharging of the vehicle battery pack 104, data can be collected from the battery pack. For example, battery packs typically include sensors 122 such as voltage, current and temperature sensors arranged to collect data from various locations within the battery pack. This information can be obtained by the maintenance device 100 via the coupling to the databus 110. During discharge, any abnormal parameters measured by the sensors can be used to control the discharge. For example, if the battery pack 104 is experiencing excessive heating, the discharge rate can be reduced until the battery temperature returns to an acceptable level. If any of the internal temperature sensors of the battery pack are not functioning, an external battery pack temperature sensor can be used to detect the temperature of the battery pack. Similarly, if cells within the pack are experiencing an abnormally high current discharge, the discharge rate can be reduced. Further still, if such data cannot be obtained because the sensors are damages or the databus is damaged or inaccessible; the maintenance device 100 can automatically enter a slow/safe discharge state to ensure that the battery is not damaged.

Some electrical vehicles include what is referred to as a "pre-charge contactor." The pre-charge contactor can be used to charge capacitances of the vehicle at a slow and controlled rate prior to switching in the main contactor 130 shown in FIG. 1. This prevents excessive current discharge from the battery pack when the main contactor is activated and the pack is directly coupled to the loads of the vehicle, including the traction module of the vehicle which is used to control electric motors of the vehicle.

In another aspect, some or all of the information obtained during testing is retrieved and stored, for example, in the memory 164 shown in FIG. 1, for subsequent access. This information can be offloaded to another device, for example a USB drive or the like, or transmitted over a network connection. The information can be information which is downloaded from the controller 108 of the vehicle 102 and may also be information related to how the vehicle battery pack 104 was discharged and removed of service.

In one configuration, the voltage sensor 232 is used to detect leakage currents in the battery undergoing discharge.

The device can also monitor battery cell voltages and temperatures to ensure that unsafe conditions are not being created during discharge.

The input/output circuitry 190 can be used to connect to a databus of the vehicle, for example, through an OBDII connection in order to collect information such as VIN, software and hardware version numbers, etc. The device can communicate with the battery ECU (Electronic Control Unit) using any appropriate protocol including CAN, LIN, or others, in order to obtain specific battery information and discharge protocols. The device can be connected as a slave unit to another piece of shop equipment, either using a hardwired connection or a wireless connection such as Bluetooth or Wi-Fi. Reverse polarity protection as well as overvoltage protection can be provided. Other safety techniques for electrical potential, temperature and axis points can be fully interlocked to prevent operation of the unit. In one configuration, the input/output 184 can include a barcode scanner which can then be used to capture specific information such as battery type or serial number as well as vehicle identification number, etc. In another example configuration, input/output circuitry 184 can include a remote temperature sensor that can be electrically coupled to the discharger to report battery temperature. This is useful when internal battery temperature sensors are damaged or inoperative. The devices are scalable such that multiple controllable loads 100 can be connected in parallel. Relay contacts can also be provided and available externally to control various circuits on the battery pack undergoing discharge. Additional voltage sensing connections such as those provided by junction box 152 can be used to monitor various circuits on the battery pack.

Another example configuration includes a high voltage DC to DC converter such as power supply 180 shown in FIG. 2. In such a configuration, the high voltage output from the battery pack can be converted to a lower DC voltage for use in powering the device.

As discussed above, in some configurations the present invention can be arranged to measure a dynamic parameter of an electrical component of the vehicle. In such a configuration, a forcing function is applied to electrical components and a dynamic parameter such as dynamic conductance, resistance, admittance, etc. can be determined based upon a change in the voltage across the battery pack and the current flowing through the battery pack. The forcing function can be any type of function which has a time varying aspect, including an AC signal or a transient signal.

Different types of junction boxes and connection cables can be used based upon the particular type of vehicle and battery pack under maintenance. The microprocessor can provide information to the operator, prompting the operator to use the appropriate junction box or cable. This can be based upon the operator inputting the vehicle identification number (VIN) to the microprocessor, or other identifying information, including an identification number associated with the battery pack. During discharging of the battery pack, the microprocessor can also provide information to the operator which indicates the time remaining to complete the discharge. The microprocessor 160 can also detect if the correct junction box and cable have been coupled to the device and to the battery pack for the particular battery pack and vehicle under maintenance. Information can be provided to the operator if the wrong cabling or junction box has been employed.

As discussed above, the device 100 can include multiple connectors for use in connecting the low voltage junction box 152 and/or the high voltage junction box 154 to the vehicle 102 and/or battery pack 104. This allows the device 100 to easily be modified to interact with different types of batteries or vehicles by simply selecting the appropriate connector. In one configuration, the connectors include some type of identifier which can be read by the device 100 whereby the microprocessor 160 and device 100 can receive information to thereby identify the type of connector in use. This allows the microprocessor 100 to know what types of information or tests may be available through the various connectors. In another example, the operator uses operator I/O 182 shown in FIG. 2 to input information to the microprocessor 160 related to the type of connector(s) being used. In another example embodiment, the microprocessor 160 may receive information which identifies the type of vehicle or battery on which maintenance is being performed. This information can be input by an operator using the operator I/O 182 or through some other means such as by communicating with the databus of the vehicle, scanning a barcode or other type of input, etc. Based upon this information, the microprocessor can provide an output to the operator using operator I/O 182 which informs the operator which type of interconnect cable should be used to couple the low voltage junction box 152 and/or the high voltage junction box 154 to the vehicle and/or battery pack.

The operator I/O 182 may include a display along with a keypad input or touchscreen. The input may take various formats, for example, a menu driven format in which an operator moves through a series of menus selecting various options and configurations. Similarly, the operator I/O 182 can be used by the microprocessor 160 to step the operator through a maintenance procedure. In one configuration, the memory 164 is configured to receive a user identification which identifies the operator using the equipment. This can be input, for example, through operator I/O 182 and allows information related to the maintenance being performed to be associated with information which identifies a particular operator. Additional information that can be associated with the maintenance data include tests performed on the vehicle and/or battery, logging information, steps performed in accordance with the maintenance, date and time information, geographical location information, environmental information including temperature, test conditions, etc., along with any other desired information. This information can be stored in memory 164 for concurrent or subsequent transmission to another device or location for further analysis. Memory 164 can also store program instructions, battery parameters, vehicle parameters, testing or maintenance information or procedures, as well as other information. These programming instructions can be updated, for example, using I/O 184 or 186, through a USB flash drive, SD card or other memory device, or through some other means as desired. This allows the device 100 to be modified, for example, if new types of vehicles or battery pack configurations are released, if new testing or maintenance procedures are desired, etc.

As discussed herein, the maintenance device 100 can be used for testing safety related aspects of the vehicle 102. The low voltage connection 152 can couple to the databus of the vehicle, such as through an OBD II connection or the low voltage connection of the charging input, and the high voltage connection can couple to various points in the vehicle power train through a connector or a probe, or to the high voltage connection of the vehicle charging input. When testing a vehicle for safety relating aspects, an initial assumption can be made that the vehicle is safe and a series of tests are run to determine if this assumption is incorrect. A series of tests are performed and if any test fails, the vehicle is determined to be unsafe. This is essentially a logical OR function. Any one of the tests which is failed can create questions regarding vehicle safety. The OR function can be divided into two categories: 1) data that the vehicle computer (or ECU, Electronic Control Unit) is aware of and can report, and 2) data that can be independently identified externally by the maintenance device 100. This can also be used to ensure that the safety determination is not biased. The output provides a "state of safety" or "SOS" of the vehicle.

The maintenance device 100 can operate as a scan tool connected to the data port of the vehicle. Any of the following are example parameters that can create questions regarding safety that warrant further investigation:

- Absolute battery voltage below a given threshold.
- Individual cell voltage below a given threshold.
- Standard deviation of cell voltages above a given threshold.
- [MAX-MIN] cell voltages above a given threshold.
- Cell conductance below a certain value. Note that this may not be directly reported by ECU but can be calculated using virtual conductance techniques such a monitoring current through a cell and voltage across a cell.
- Cell conductance standard deviation above a certain threshold.
- Faults reported by the ECU.
- Any cell not reporting data.
- Any temperature sensor not reporting data.
- Any current or voltage sensor not reporting.
- Airbags were deployed.
- Internal current leakage fault.
- Other safety related PID (parameter ID) values.

An external validation device, such as maintenance device 100:

- Can report any current leakage value of a battery pack to the vehicle chassis resulting from one of the following:
- Insulation breakdown or degradation
- Electrolyte seepage
- Burst cells
- Mechanical breakdown of internal components
- Contamination in battery pack
- Seal failure
- Water ingress
- Structural damage to pack Although some of these parameters can be measured with a scan tool, with the present invention a determination of safety based on the values, or combination of values is made, for example by microprocessor 160. The parameters can be processed by a rule set to arrive at a safety determination. In order to measure leakage current, device 100 can be coupled to a battery pole, for example the B+, B− MSD, or auxiliary ports of battery pack 104 and determine the impedance to ground at any other point in the circuit. With this measurement, it does not matter where the fault is relative to the test point. An adapter can be provided that is received in the CCS DC charge point, sending commands to close the contactors, and check from one of the poles. Although some battery packs have internal leakage circuits, they may be unreliable and will not suffice for safety inspections.

Another aspect of the invention relates to measuring electrical isolation of components. Isolation is conventionally measured by what is referred to as a HIPOT test, which stands for high potential. This is used to check the integrity of insulation systems, primarily on AC wiring. A voltage is selected that is some considerable factor above the working voltage of the system, and applied to each conductor relative to another component, such as the vehicle chassis. Ideally, there should be no conduction. However, in practice, there is always some form of a high resistance electrical pathway and the actual isolation will be greater than some selected number of megohms. It is considered a non-destructive test, in that the insulation is not damaged as a result of this test. The present invention includes checking the insulation of the AC charge port using either this method, or a small signal AC based forcing function.

For battery systems, regardless of the presence of any leakage path, the leakage is not visible to the test equipment unless the potential applied exceeds the battery string voltage. However, at this voltage level, the test is a destructive test. As such, this test of the safety of the insulation actually results in a degradation to the system. This is because of the sensitive nature of battery cells. They are not simple insulation systems, but complex systems with electrolyte, separators, electrodes, and other components. Exceeding a voltage across a cell causes breakdown of the separator, which leads to failure. This method is used during the manufacture of cells as a spot check of separator integrity, but those cells are discarded following the test procedure. For this scenario, a small signal AC forcing function can be used to detect the leakage without exceeding the battery voltage. The AC signal will pass through the cell, elevating both the anode and cathode simultaneously.

In one aspect, a small AC voltage at a low frequency is generated. The frequency can be chosen as desired, but preferably in the ELF (extremely low frequency) range. In specific configurations, 50 HZ or 100 HZ are used. However, other frequencies may be used as desired. This signal can be applied to a tuned circuit (voltage divider) and capacitively coupled the into the battery string. The output of the voltage divider is monitored between the divider and the coupling capacitor. When the circuit is "loaded" on the battery side due to the presence of isolation resistance, the test equipment monitors the degradation of the drive signal and can solve the resulting equation for the unknown isolation resistance. Further, this configuration is not sensitive to where the leakage is located within the high voltage string.

The measurement equipment can test the leakage of the available circuits, either through the charge port, or any other point in the system that allows access or an electrical probe or connection. This may be at the manual safety disconnect, which provides access to the individual halves or sections of the battery system. Other locations can be accessed, for example, through any high voltage accessory port, such as the AC compressor.

Vehicles generally have two types of charge ports: Those that accept AC power only (either single or 3 phase), or those that accept both AC and DC.

The measurement system can test all types of connections. The AC connections can be tested by either the AC signal method disclosed herein, or a conventional HIPOT test. The DC charging connection can only be tested using the AC signal model.

Electric vehicle charging connectors vary widely by manufacturer and location. One preferred connection is a standard unit with the NACS (North American Charging System) connector. This type of connector is preferred because it provides AC and DC connections, along with data communication, in a very small format. Adapters can be used that convert this to other connector standard such as J1772, CCS1, CCS2, or others. In another configuration, region specific units can be provided that have the appropriate connector built in. The main assembly is the same, but customized connectors can fit into a storage area in the housing of device 100.

Additionally, the AC or DC charge contactors 131 can be instructed to close. Communication can be achieved with the vehicle using, for example, the data connection when element 121 is configured as a charging plug. For example, the control pilot pin can be used to instruct contactors 131 to close. For example, using the HomePlug Green PHY protocol. Such configurations allow communication of data over a power connection.

There are vehicles which are equipped with vehicle-to-grid charging connection. In such a configuration, the vehicle does not expect to see a charger connected to the charging port and instead receives a line voltage AC input. However, most vehicles do not have this ability, in which case, the vehicle must be instructed to close the contactors without a charger present. One way which this can be implemented with some vehicles is simply to communicate to the vehicle computer indicating that there is a charger connected. Once the contacts close, there is no way for the vehicle to detect this because the vehicle sees the same voltage outside the car and inside the car because the voltages are all generated by the vehicle battery. Another technique that can be used to instruct the contactors to close is to generate a high voltage reference at a low current level (not enough to charge, but enough for the vehicle to read a voltage). Once the contactors close, they will remain closed.

Element 121 can be configured as an electrical connector configured to connect to various standard connectors of vehicle 102 such as connectors used to connect to battery pack 104, an internal DC to DC converter in vehicle 102, the charging port 123, or other components. Element 121 can also be configured as a probe such that an operator can manually touch the probe 121 to various locations in vehicle 102. For example, probe 121 can be used to probe various points along the string of batteries that make up battery pack 104. A display in operator I/O can be used to instruct an operator where to place the probe through written instructions and/or images.

In the automotive diagnostic and maintenance industry, various tools have private network connectivity options using various interface protocols such as Bluetooth®, Wi-Fi, Zigbee®, Thread/Matter, etc. These protocols, and others, allow the maintenance devices to communicate on local private networks. With the present invention, the devices can dynamically create clusters (with user input or preconfigured) for resource and data sharing as well as result correlation. Device 100 is an example implementation of a maintenance device configured in accordance with the invention.

With the present invention, a proprietary discovery and hierarchy protocol is executed on top of this network. This protocol allows the discovery of various capabilities across each device. Each maintenance device advertises its own unique identification and capabilities. This information is then shared with other devices in the cluster.

Once discovered, these devices can notify an operator using the user interface 182 or using a configuration algorithm so that they are added to the cluster. Based on the resources they advertise (e.g., memory, processor, UI, printer access, network/Internet access, scanner, etc.) as well as capabilities, these tools will be assigned a weight when joining the cluster. This algorithm can be stored in memory 164 and implemented in the microprocessor 160 of one or more of the devices which form the cluster.

Once this cluster is formed, the device 100 with the highest weight is elected/selected as the cluster master. This cluster master is responsible for managing the cluster and reporting which services and functionality are available inside this tool cluster.

Resources from each of the devices 100 in the cluster that are available are now a part of this cluster. Inputs accepted from the various devices 100, such as a VIN scan, an operator input etc., become a common identification (ID) for tests done by devices 100 within this cluster. This allows the user to only input data at a single shared user interface, which is then shared across all of the devices 100 in the cluster. The maintenance devices 100 report their interim results/data back to the cluster master.

Once all the tests pertaining to the single unit/vehicle are completed, the cluster master collates all the interim results. The master is then the responsible to upload the information to the information portal/endpoint (either processed or raw data) as desired.

This configuration if particularly useful due to the complexity of EV vehicles and management/validation of the battery/batteries. As EVs are becoming more common, the servicing and inspection of such vehicles is also becoming more complex, requiring multiple tools in workshops and inspections for regulatory bodies.

This invention applies to inspection/management/testing/validation of multiple aspects of battery (in vehicles with internal combustion engines or other legacy vehicles) or batteries (for EVs that have multiple batteries—High Voltage and Low Voltage) for various functions/controls.

When validating or managing batteries, multiple tools can be used either in sequence or in parallel when working on the vehicle. For example, low voltage tools can be used for validating the low voltage 12V battery, specifically for reserve charge, state of charge (SoC), state of health (SoH), and other parameters, to determine the capacity/health of the battery. While the high voltage tools can be used to validate other high voltage (HV) parameters related to the performance and/or safety of the HV battery pack which is used to power the vehicle.

In environments such as workshops and vehicle inspection facilities, it is desirable to minimize the required inputs and the time needed to work on a vehicle. In order to optimize the time required to service/inspect a vehicle with multiple tools, the invention provides a way to allow multiple tools to create a cluster of tools which are used for one vehicle, or used in a single inspection lane across multiple stations within the lane.

This cluster of maintenance devices is able to internally discover each other and notify an operator. The operator can then allow connectivity between the devices. Although the discovery is dynamic across multiple devices, a user input can optionally be required to allow formation of the cluster for security reasons as well as maintaining a hierarchy between the devices. The cluster can also be formed automatically if desired. Discovery of the devices is performed using available wireless protocols across the devices, for example, Bluetooth, Zigbee, Wi-Fi adhoc networks, etc., using wireless I/O 186. These devices create a private, secure network that allows them to advertise the resources available to each other such that the resources can be shared within the cluster. This enables resource sharing, for example, some tools may have an input device such as a scanner, QR code reader, etc., that may simplify user input by scanning the VIN/battery information from a battery or vehicle. Other tools may have resources such as a local/connected printer, internet connectivity to the cloud, certain test capabilities, etc.

Another aspect of this device cluster is that it enables the collating of results across the various tests performed by the devices into a single consolidated piece of data. This consolidates the data and the reporting of the data. This enables a better understanding of various results and also allows the correlation to identify parameters and the root cause of issues using causality of symptoms observed across various tests performed. In addition to the various tests discussed herein, element 152 can also comprise other types of testing apparatus such as a tire pressure tester, tread depth gage, compression tester, exhaust analyzer, voltage or current sensor, or other test or measurement device that are used with vehicles.

Once formed, this cluster becomes a single logical entity acting like a single instance of a maintenance device which has multiple test/measurement capabilities, although internally to the cluster, multiple tools are performing the various independent tests/measurements.

Figure 3:
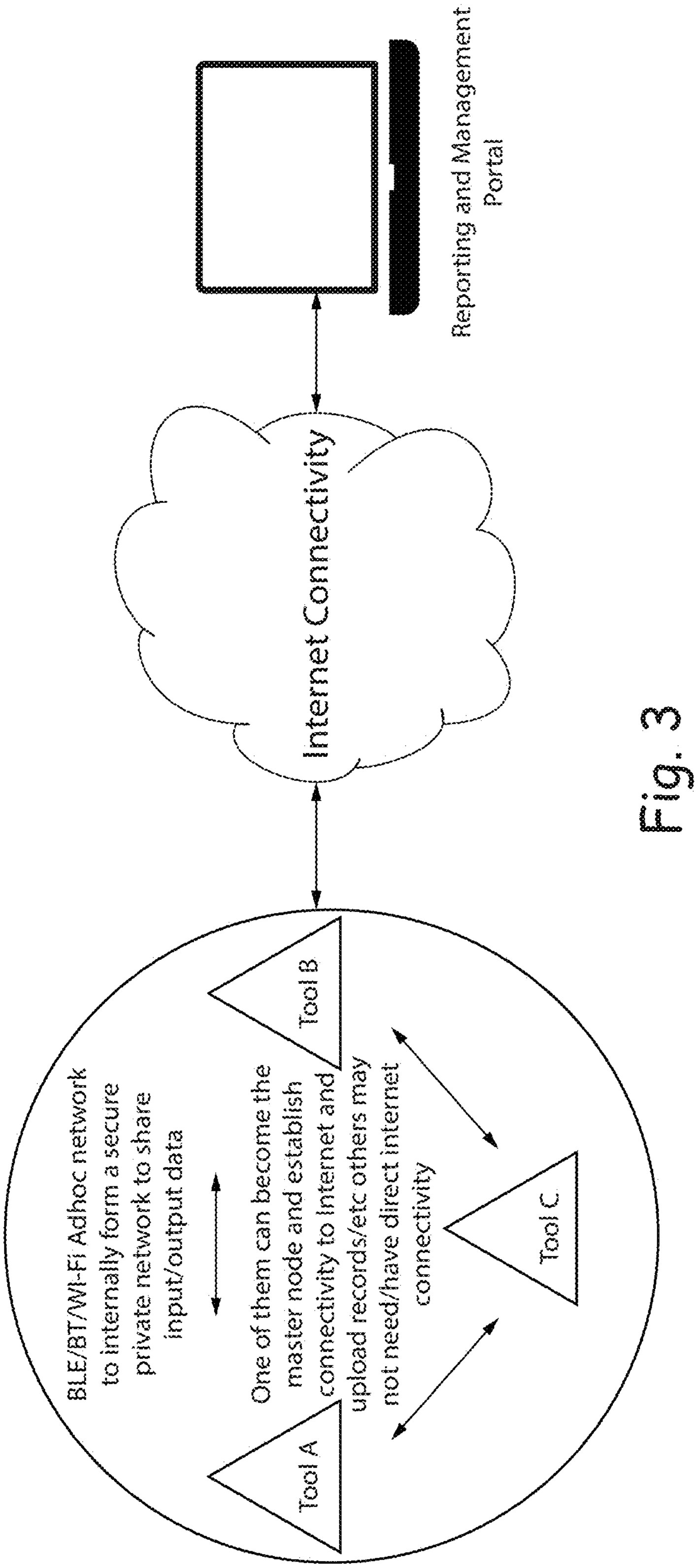
FIG. 3 is a diagram illustrating a virtual cluster formed in a mesh using three different tools which communicate over the internet to a reporting and management portal.

If one of the devices within the cluster goes offline, the device will be removed from the cluster after a timeout period. To detect the status of a device, the devices can periodically send heartbeat messages to the other devices in the cluster. Cluster membership is dynamic but, in some embodiments, can require an input from an operator to add or delete a device from the cluster. The cluster membership can also be pre-provisioned so that a certain set of devices are automatically allowed membership. Cluster master selection is also dynamic and can be based on capabilities/resources of the devices. If a master goes offline, a new master is selected from the other tools in the network within a finite amount of time. In another configuration, the cluster can be provisioned with a fixed master and the cluster then be dissolved if the master goes offline. FIG. 3 is a diagram of a virtual cluster formed by three tools A, B and C having internet connectivity to a central reporting or management portal.

Figure 4:
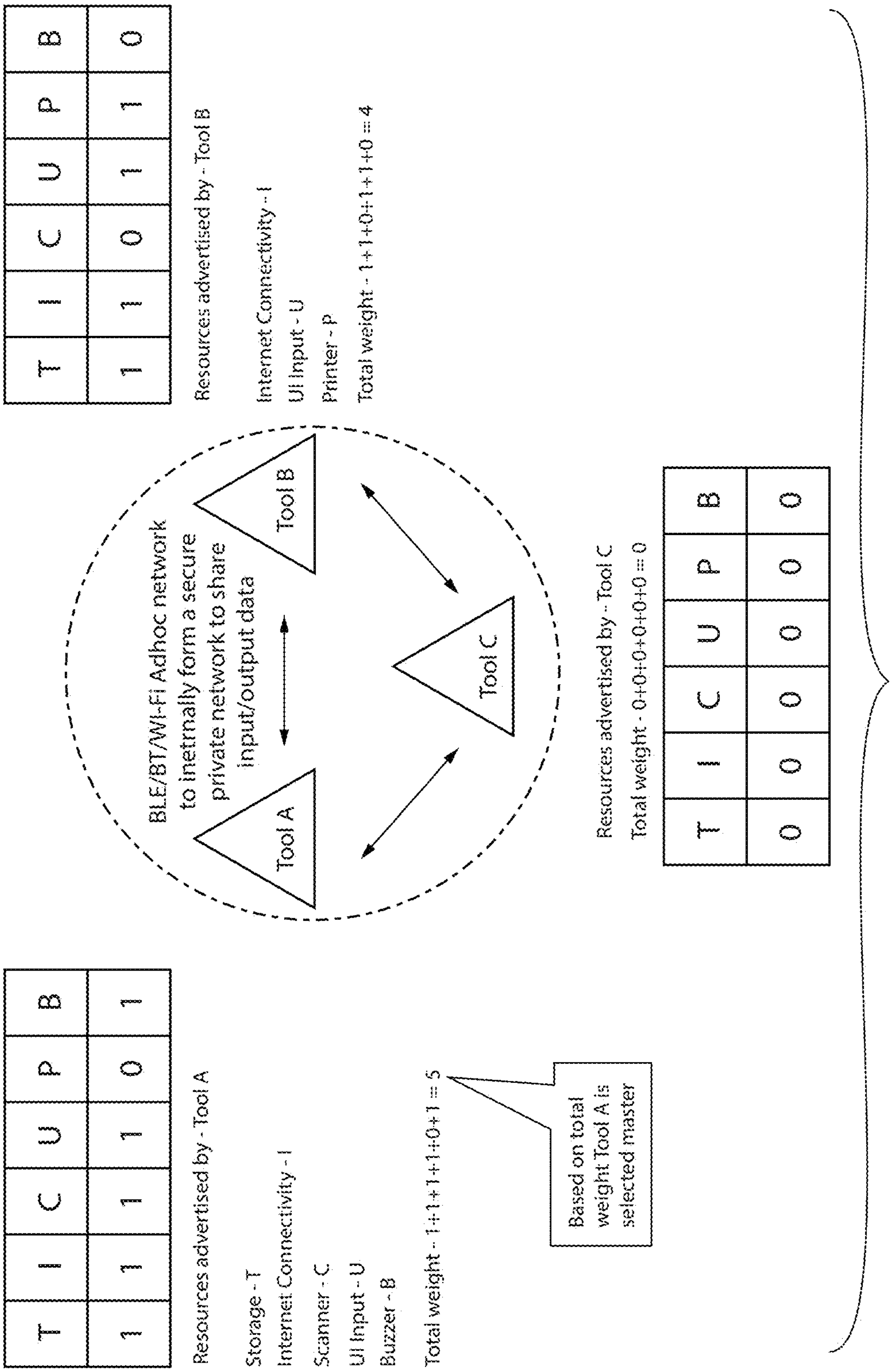
FIG. 4 shows resource advertisement by three tools in a virtual cluster.

FIG. 4 is a diagram showing one example weighting configuration for use in forming a cluster of tools. In FIG. 4 each tool advertises its capabilities including storage (T), internet connectivity (I), the presence of a scanner (C), the presence of a user input (U), the presence of an audio output or buzzer (B), and the presence of a printer (P). In this configuration, the presence of any of these items is given a weight of one, however, different weighting factors can be used as desired. With this arrangement, tool A has a weight of 5, tool B has a weight of 4 and tool C has a weight of zero.

Figure 5:
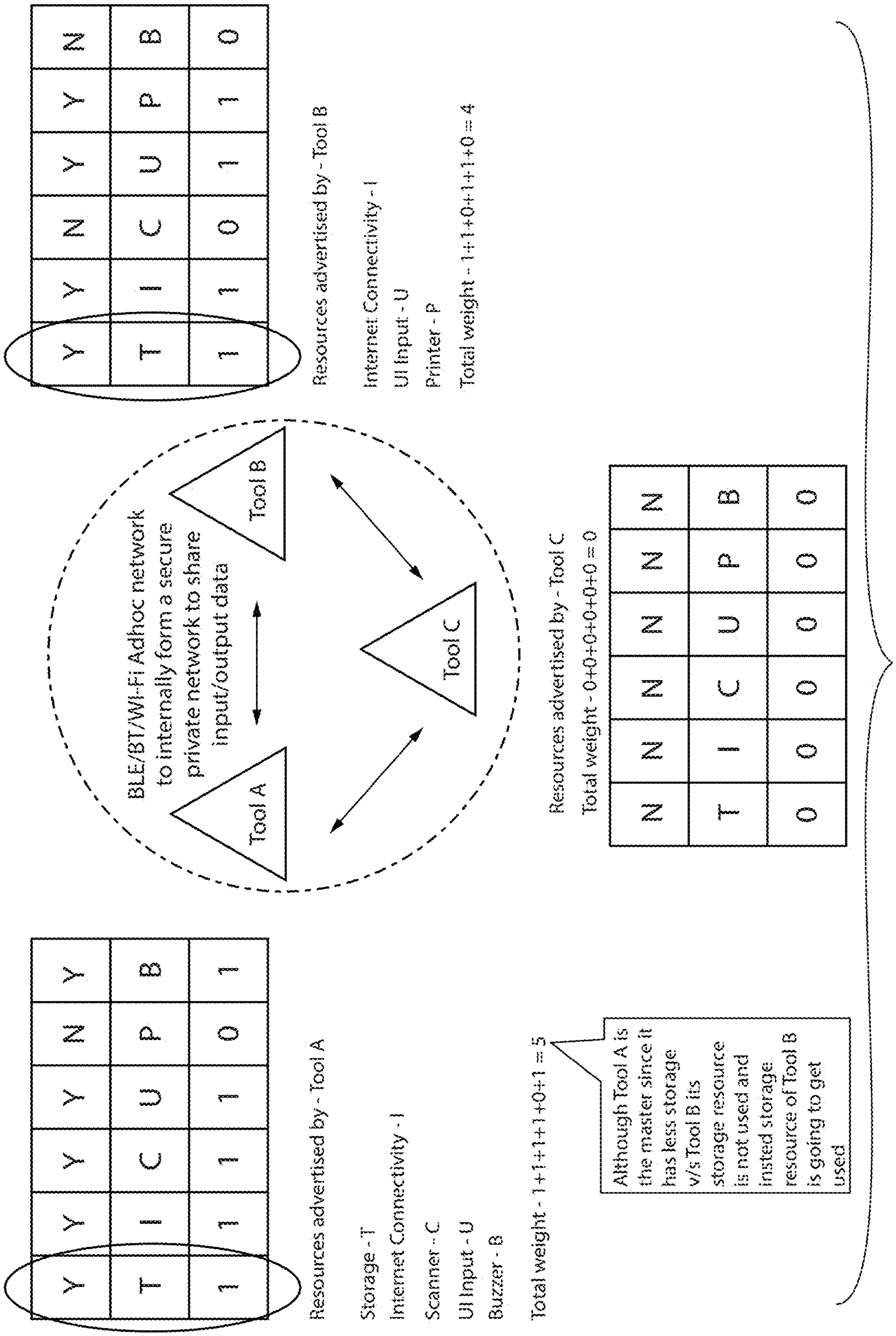
FIG. 5 shows a diagram illustrating the selection of various resources within tools of the mesh cluster.

FIG. 5 is a diagram showing how resources are selected for use. In addition to advertising the presence of a particular capability, information related to that capability is also advertised. For example, if tool B has more storage than tool A, tool B can be selected as the device on which data is stored. Other capabilities can also be advertised with such ranking information. For example, one device might have a faster internet connection, a hard-wired network connection, a display versus a simple audio output, specific measurement capabilities, etc.

The configuration provides a dynamic private network cluster for battery tool resource management and sharing. This can be through a weighted mesh network. This is an enhancement to the existing mesh master/controller selection using a weighted algorithm where each resource is allocated a weight factor based on its usefulness in the cluster. For example, a display and keyboard interface is given a factor of 10 while a simple buzzer is allocated a factor of 1. So, in this example when the cluster starts assigning weights, the master is not selected only based on how many resources they contain (simple additions of 0 or 1), but based on which resources and the importance of the resource in the mesh.

Figure 6:
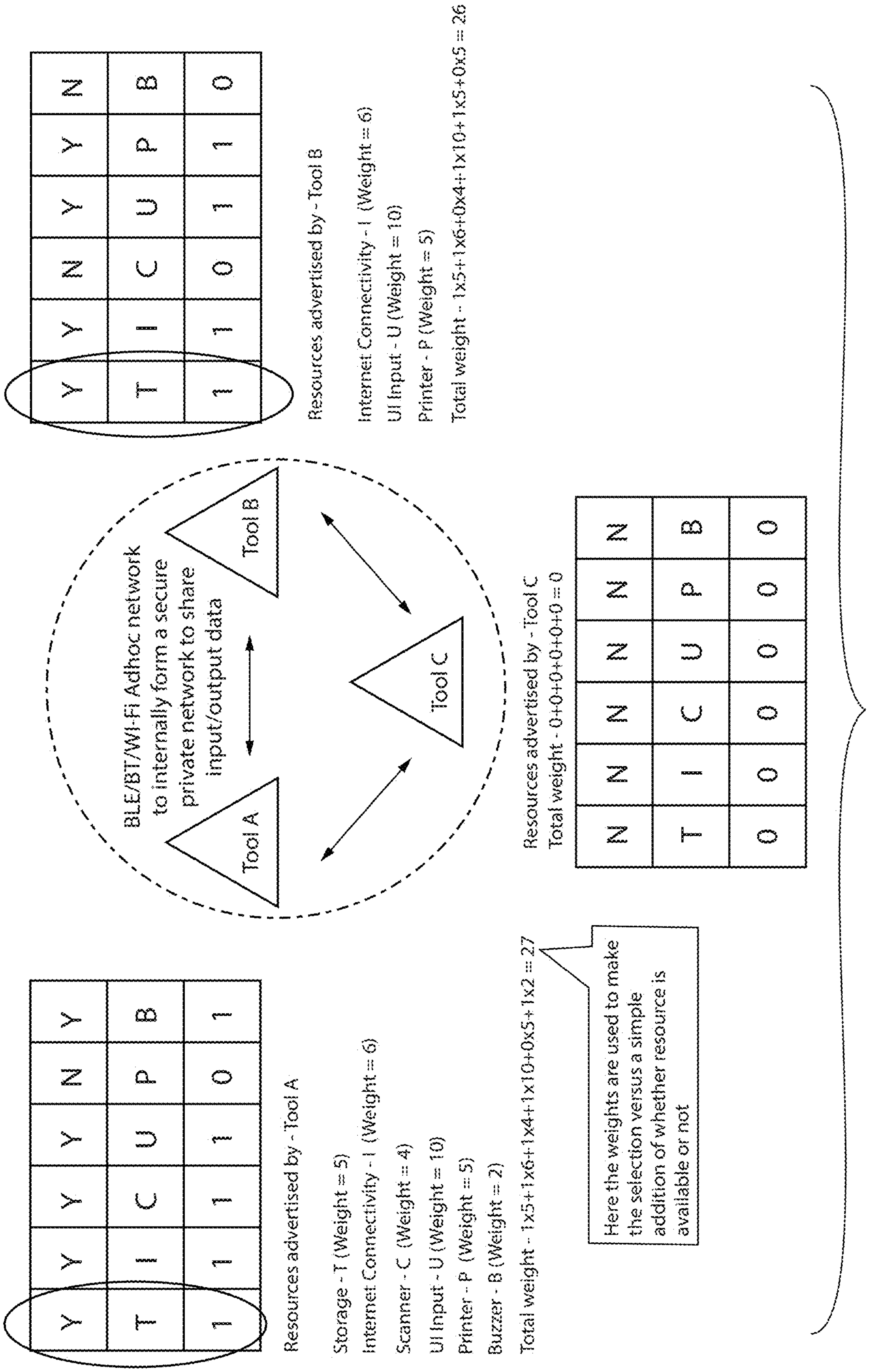
FIG. 6 shows a diagram illustrating the selection of various resources within tools of the mesh cluster.

FIG. 6 shows another example of this capability advertisement: Each tool advertises its unique ID and capabilities (e.g., memory, processor, UI, printer access, network/Internet access, scanner). These capabilities are then weighted. The same mesh model is now updated as shown in FIG. 6.

In this configuration, weights are assigned to each capability, with more critical capabilities (e.g., Internet connectivity, VIN scanner) having higher weights.

The weights are assigned based on usefulness and importance of resources to the complete cluster.

1. Storage—T (Weight=5)
2. Internet Connectivity—I (Weight=6)
3. Scanner—C (Weight=4)
4. UI Input—U (Weight=10)
5. Buzzer—B (Weight=2)
6. Printer—P (Weight=5)

The tool with the highest combined weight is selected as the cluster master and is responsible for managing the cluster and coordinating tasks. Tools dynamically discover each other and notify the user for cluster formation. The tool with the highest weight becomes the master. If the master tool fails, another tool with the next highest weight takes over, ensuring continuity. In case of a tie in weights between two or more devices, additional criteria such as unique capabilities (e.g., printer, buzzer) are used to select the master.

Figure 7:
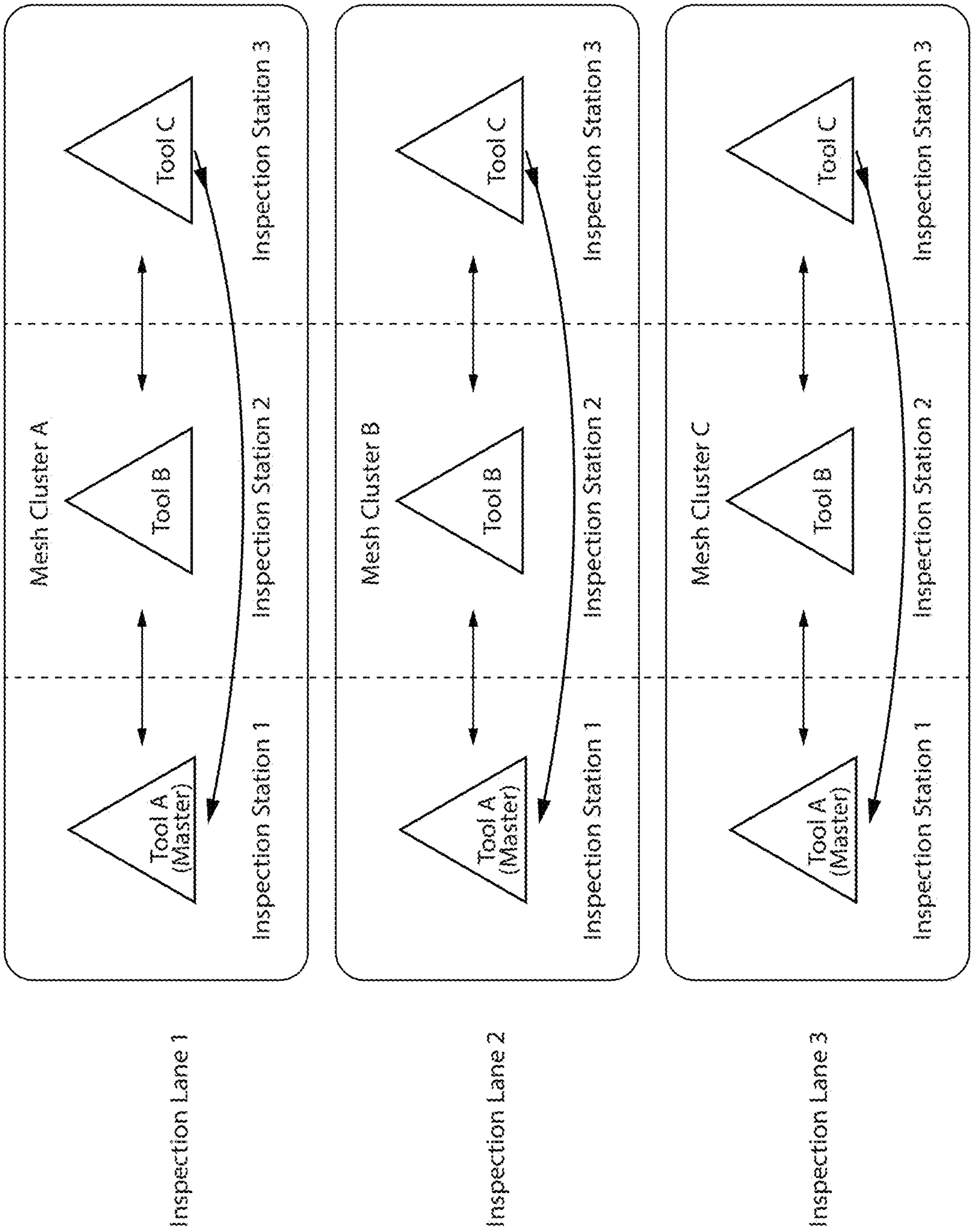
FIG. 7 is a diagram showing three inspection lanes in a testing facility with each of the inspection lanes including three distinct tools.

FIG. 7 shows three different tool types deployed across three inspection lanes in a vehicle inspection facility. A vehicle follows an inspection lane and goes from one station to another in a specific sequence, and a specific set of tests are run at each station. Here the tools may be the same or different, e.g. the same high voltage safety tool is used at station 1 as well as station 3, while another low voltage safety or immobilizer tool is used on station 2. Moreover, even if the same tool is used across multiple stations, for example at stations 1 and 3, station 1 may be only running 3 out of total 4 tests (immobilizer, AC touch current and AC insulation tests), while at station 3 there may be a lift available to access underside of the car such that an additional test can be performed.

In this scenario, the tools in a cluster must also maintain some sort of sequence when pairing, as the tools need to maintain the order which they are activated at which station or order in the specific sequence. And, until all the data is collected by the master controller, it cannot be uploaded. In this configuration, each tool is assigned an order/sequence ID in the cluster at the time of provisioning. For example, these tools are assigned a sequence as:

Tool A—S1 (Master based on above weights).

Tool B—S3

Tool C—S2

Tools in the inspection lane operate in a specific sequence (e.g., S1→S2→S3). However, as discussed above, since these tools have different capabilities, and the master is responsible for collating all the data from all the tests performed by A, B, C, only then once the tool B (sequence S3) is completed with its tests and has sent its results to the master can the master collates all the results internally and upload the data to the backend server through internet connectivity.

This sequence number assignment is a unique capability of this cluster provisioning to maintain the order of tests and results in an inspection facility. This may be also be used in cases such as dealer workshops or salvage yards where specific operations are done in a different order to either perform repairs and/or removal of components in salvage yards where the tools are used prior to harvesting various components of the cars like batteries, DC-DC converters, etc.

The master tool can be any tool in the sequence, but must ensure all data is gathered before sending records upstream. The master tool cannot send the recorded data until all information is gathered from each tool in the sequence. The dataset is marked complete only after the VIN scan and all data intake is finished.

Figure 8A:
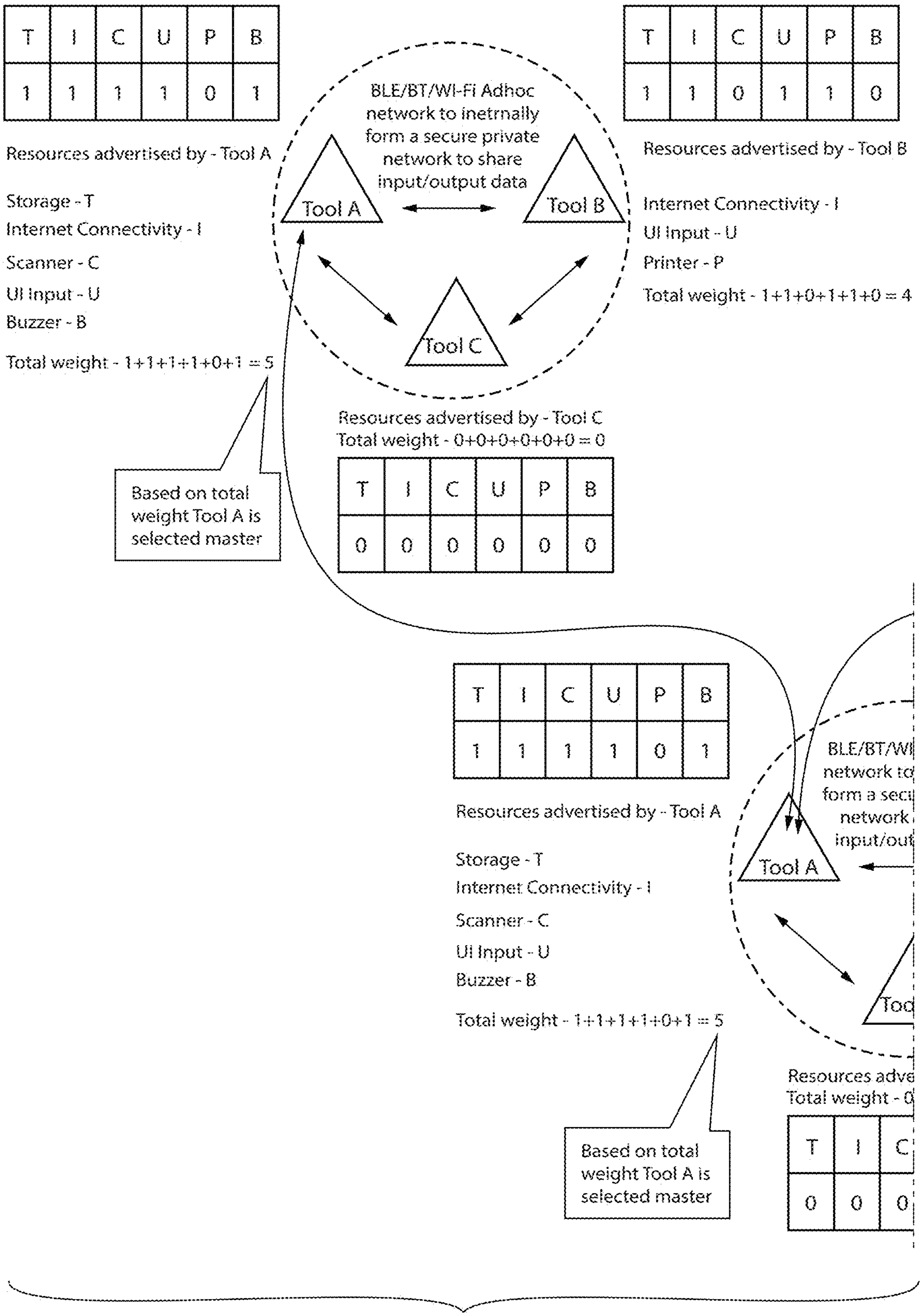
FIGS. 8A and 8B illustrate resource sharing between tools in different mesh clusters.
Figure 8B:
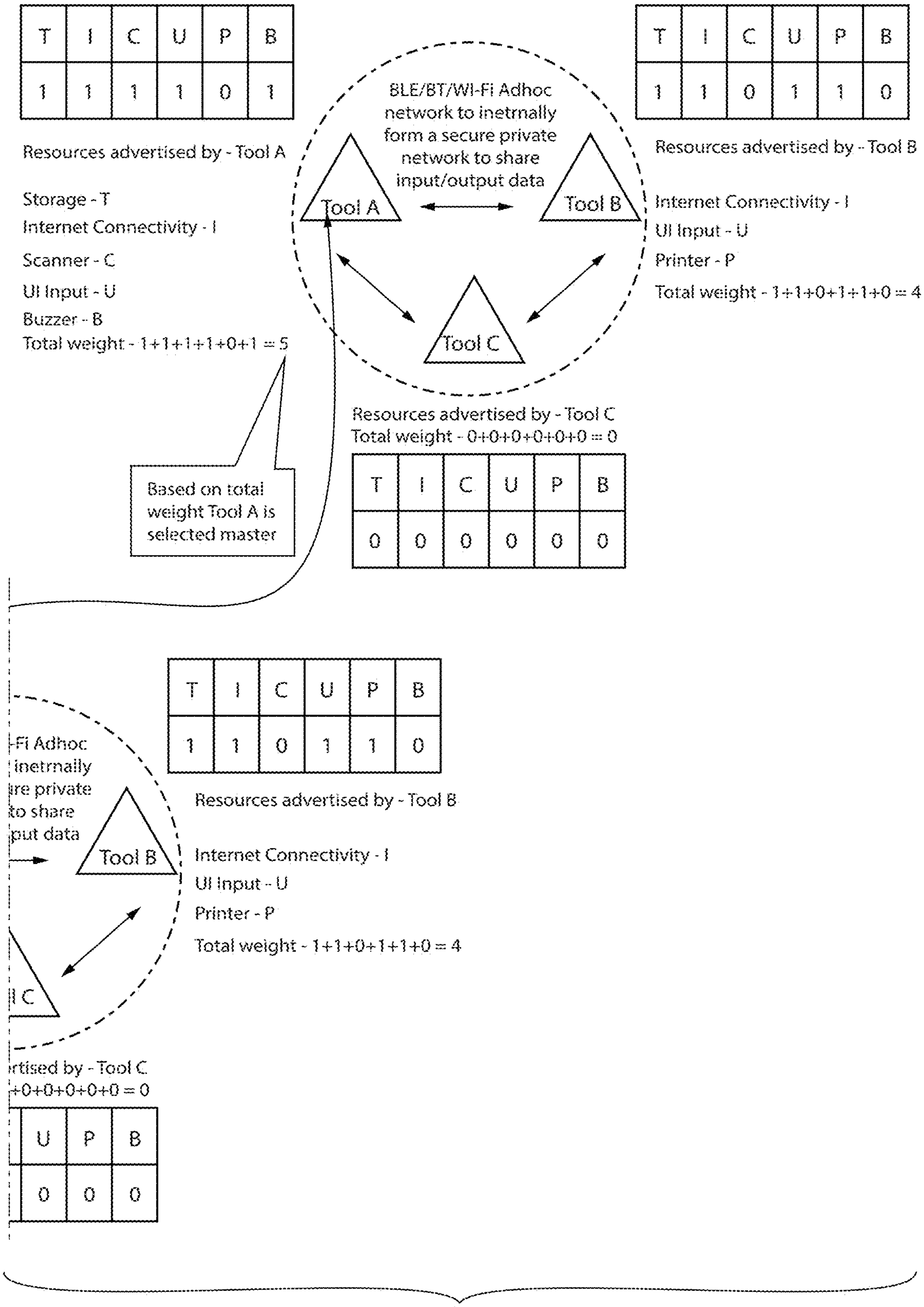

The configuration also provinces inter-cluster communication capabilities. Tools within a cluster can share resources. For example, a tool without a printer can use another tool's printer. This can be used for redundancy where there is a facility with multiple clusters of tools. Each cluster is identical but with a different instance of tools. If there is a need to share resources across clusters or mesh, then the masters across these meshes can communicate and share those resources, as illustrated in FIG. 8. Each cluster can communicate with the other clusters in the same deployment facility. For example, if each mesh is tied to an inspection lane and there are multiple inspection lanes in the same facility, then master controllers across clusters can communicate the health and other information such that if one cluster is impaired the other clusters get notified and can lend their resources to the impair cluster.

The master tool collects data from all tools and sends it upstream as a single record, ensuring seamless data integration and processing for analytics and archiving. Tools can be replaced and given the same identity to maintain the processing chain, ensuring new tools integrate smoothly without disrupting the workflow.

The system can include a mechanism for persistently storing the mesh configuration, for example, in memory 164 of the device. This ensures that the configuration details are retained even if the master tool is impaired or replaced. The mesh configuration is stored in a non-volatile memory within the master tool and optionally in a central server or cloud storage. The stored configuration can include details such as tool IDs, capabilities, weights, operational sequence information, and master selection criteria. This persistent storage allows for quick recovery and reconfiguration of the cluster in case of master tool failure.

Automatic configuration retrieval can also be implemented. When a new master tool is introduced to replace an impaired one, the system automatically retrieves the stored configuration. The new master tool accesses the non-volatile memory or central server to download the existing mesh configuration. The retrieved configuration is applied to the new master tool, ensuring seamless integration into the cluster. This process minimizes downtime and ensures continuity in the cluster's operation.

In another configuration, the system can periodically synchronize the mesh configuration across all tools in the cluster. Each tool in the cluster maintains a local copy of the mesh configuration. The master tool periodically updates the configuration to ensure consistency across the cluster. In the event of a master tool failure, the most recent configuration is readily available for the new master tool.

The system can also include a robust failover and recovery mechanism to handle the replacement of the master tool. Upon detecting the failure of the master tool, the system initiates the failover process. The tool with the next highest weight is selected as the new master. The new master tool retrieves the stored configuration and resumes the management of the cluster. This mechanism ensures that the cluster remains operational with minimal disruption.

The system can provide notification to the user in case of master tool failure and during the replacement process. This can be through operator I/O 182, or transmitter over the network. Users are notified of the master tool failure and the initiation of the failover process. The system provides instructions for introducing a new master tool and retrieving the stored configuration. User intervention is minimized, but the system allows for manual adjustments if necessary. For example:

1—Master Tool Failure: The current master tool (Tool A) fails during operation. The system detects the failure and initiates the failover process.

2—Selection of New Master Tool: The tool with the next highest weight (Tool B) is selected as the new master. Tool B retrieves the stored mesh configuration from the non-volatile memory or central server. In this case the mesh is not in a completely operational state as some of the resources are impacted but can still be partly functional 3—Configuration Application: Tool B applies the retrieved configuration, including tool IDs, capabilities, weights, and operational sequence. Tool B seamlessly integrates into the cluster and resumes management duties.

4—User Notification: The user is notified of the master tool failure and the successful replacement with Tool B. The system provides any necessary instructions for further actions, if required.

5—Replacement of Failed Tool: A new instance of Tool A (Tool A') is introduced to replace the failed Tool A. Tool A' automatically retrieves the stored mesh configuration from the non-volatile memory or central server. Tool A' downloads and applies the stored configuration information, including tool IDs, capabilities, weights, and operational sequence.

6—Integration and Operation: Tool A' integrates into the cluster, taking over the role and responsibilities of the original Tool A. The mesh/cluster becomes fully operational with minimal downtime, ensuring continuity in the inspection process.

The persistent storage and automatic retrieval of the mesh configuration ensure that the cluster remains operational with minimal downtime. The new master tool can quickly integrate into the cluster, maintaining continuity in operations. The failover and recovery mechanism enhances the overall reliability and robustness of the system. The system minimizes the need for user intervention, providing a seamless and user-friendly experience.

Once a cluster is configured and operational, its configuration can be saved. This saved configuration includes details such as tool IDs, capabilities, weights, and sequence. This feature allows for the replication of an established cluster configuration across multiple inspection lanes within a facility, ensuring identical setup without the need to redo the complete configuration process for each lane.

The logical cluster configuration, including its operational sequence and master tool selection criteria, can be cloned. This ensures that new lanes have the same tool setup and operational logic as the original cluster. Cloning is particularly useful in large inspection facilities with multiple lanes, ensuring consistency and efficiency across all lanes.

A dedicated module within the system handles the saving, downloading, and cloning of configurations. Users can access this module through a user-friendly interface to manage cluster configurations. This can be implemented in a separate controller 160. The module ensures that configurations are stored securely and can be easily retrieved, facilitating easy cloning of clusters for new lanes or facilities.

The system supports automated deployment, where users can select a saved configuration and deploy it to new lanes. The deployment process automatically configures all tools in the new lane according to the saved configuration. This feature reduces setup time and ensures consistency across lanes, minimizing errors in configuration.

The system is designed to be scalable, allowing for the addition of new lanes and tools. New lanes can be added by cloning existing clusters, ensuring seamless expansion. The system can accommodate additional tools and lanes as needed, maintaining flexibility and adaptability.

The system allows for the replication of cluster configurations across different facilities. This ensures that the same set of tools and operations can be maintained in different inspection facilities, even if they are located in different suburbs or regions. The saved configuration can be stored as a template and replicated across multiple facilities. Each facility can download and apply the template configuration, ensuring consistent tool setup and operational logic. This feature is particularly useful for organizations with multiple inspection facilities, allowing them to maintain uniformity and efficiency across all locations. For example:

Replication Across Facilities: The saved mesh configuration is stored as a template. A new inspection facility in a different suburb or region downloads the template configuration. The new facility applies the configuration, ensuring the same tool setup and operational logic as the original facility. This allows for consistent and efficient operations across multiple facilities.

The ability to replicate cluster configurations across different facilities ensures uniformity and efficiency in operations, regardless of location. Regulatory bodies can use this system for efficient and comprehensive vehicle inspections. OEMs and dealerships can use the system for servicing and maintaining vehicles. Companies providing aftermarket services for low and high voltage battery systems can benefit from this tool cluster.

A unique discovery protocol is implemented that allows tools to discover each other and advertise their capabilities dynamically. This ensures secure and efficient formation of clusters with user input for added security. The master tool manages the cluster, listing available services and coordinating tasks. This ensures that all tools work together seamlessly, even if they have different capabilities. Further, this ensures that data collected from all tools is accurate and securely transmitted to the upstream server. Uses encryption and secure communication protocols can be used to protect data integrity. A single shared UI for data input can be provided, reducing the need for multiple inputs and simplifying the user experience. This can be used to guide users through the testing process with clear instructions and feedback.

The system allows for the replication of an established cluster configuration across multiple inspection lanes within a facility. Once a cluster is configured and operational, its configuration can be saved. The saved configuration can be downloaded to form new instances of the cluster in different lanes. This eliminates the need to redo the complete configuration process for each lane.

The system supports cloning of logical clusters to create identical clusters in new inspection lanes. The logical cluster configuration, including tool sequence and capabilities, can be cloned. New lanes can be added by simply cloning the existing cluster configuration. Ensures consistency and efficiency across multiple inspection lanes.

The system includes a configuration management module that handles the saving, downloading, and cloning of cluster configurations. The configuration management module stores the cluster configurations. Provides an interface for users to save and download configurations. This facilitates easy cloning of clusters for new lanes or facilities.

The system supports automated deployment of clusters based on saved configurations. Users can select a saved configuration and deploy it automatically to new lanes. The system ensures that all tools in the new lane are configured identically to the original cluster. This reduces setup time and minimizes errors in configuration.

The system is scalable and flexible, allowing for the addition of new lanes and tools without disrupting existing clusters. New lanes can be added by cloning existing clusters. The system can accommodate additional tools and lanes as needed. This ensures seamless integration and scalability.

Although the present invention has been described with reference to preferred embodiments, workers skilled in the art will recognize that changes may be made in form and detail without departing from the spirit and scope of the invention. The invention is suitable for many configurations. For example, vehicle inspection centers (regulatory), original equipment manufacturers, servicing locations and dealership, and aftermarket vehicle/battery (both low voltage and high voltage) servicing. Various components of the invention can be implement in microprocessor/controller 160 operating in accordance with instructions stored in memory 164. For example, microprocessor/controller 160 and memory 164 can implement cluster forming circuitry used to form cluster among a plurality of tools and data sharing circuitry used to share data between tools. Wireless I/O 186 may also be configured as a wired connection in some configurations. Input/output circuitry 162/184 can provide any time of input or output, including a printer, a scanner, a camera, or other device. The cluster provides a dynamic mesh network in which tools can be added or removed from the cluster.

What is claimed is:

1. A plurality of automotive vehicle maintenance tools each of which includes:

communication circuitry which provides communication between at least another tool in the plurality of tools;

cluster forming circuitry configured to form a cluster of tools comprising at least two tools in the plurality of tools;

data sharing circuitry configured to share data between the at least two tools in the cluster of tools;

wherein each of the plurality of tools in the cluster of tools has at least one operational capability and the at least one operational capability is shared with other tools in the cluster of tools using the data sharing circuitry;

wherein each of the plurality of maintenance tools advertises its capabilities to other tools in the cluster of tools; and wherein each advertised capability is given a weight.

2. The apparatus of claim 1 wherein in a master tool for the cluster of tools is selected based upon a highest total weight of capabilities.

3. The apparatus of claim 1 wherein a capability of a tool is selected to be shared based up a weight assigned to the capability.

4. The apparatus of claim 1 wherein a user input is required to add a tool to the cluster of tools.

5. The apparatus of claim 1 wherein the cluster of tools forms a lane in a testing facility.

6. The apparatus of claim 5 including a plurality of lanes each including a cluster of tools.

7. The apparatus of claim 6 wherein each of the cluster of tools includes a master tool.

8. The apparatus of claim 7 wherein master tools are configured to share data with a master tool in another cluster of tools.

9. The apparatus of claim 1 including memory configured to store a sequence of operation of tools in the cluster of tools.

10. The apparatus of claim 1 including memory configured to store configuration information related to the configuration of the cluster of tools.

11. The apparatus of claim 1 wherein the at least one operational capability relates to a testing capability.

12. The apparatus of claim 1 wherein the at least one operational capability relates to an input/output capability.

13. The apparatus of claim 1 wherein the at least one operational capability relates to a storage capability.

14. The apparatus of claim 1 wherein a tool can be removed from the cluster of tools.

15. The apparatus of claim 14 wherein a new tool can be added to the cluster of tools and receive information related to a configuration of the cluster.

16. The apparatus of claim 11 wherein the testing capability relates to testing a battery of an electric vehicle.

17. The apparatus of claim 1 wherein each tool in the cluster of tools includes identification information which is shared with other tools in the cluster of tools.

18. A plurality of automotive vehicle maintenance tools each of which includes:

communication circuitry which provides communication between at least another tool in the plurality of tools;

cluster forming circuitry configured to form a cluster of tools comprising at least two tools in the plurality of tools;

data sharing circuitry configured to share data between the at least two tools in the cluster of tools;

wherein each of the plurality of tools in the cluster of tools has at least one operational capability and the at least one operational capability is shared with other tools in the cluster of tools using the data sharing circuitry;

wherein the cluster of tools forms a lane in a testing facility;

wherein the testing facility includes a plurality of lanes each including a cluster of tools;

wherein each of the cluster of tools includes a master tool; and wherein master tools are configured to share data with a master tool in another cluster of tools.

* * * * *